United States Patent
Yasuda et al.

(10) Patent No.: US 8,980,525 B2
(45) Date of Patent: *Mar. 17, 2015

(54) CHEMICALLY AMPLIFIED POSITIVE RESIST COMPOSITION AND PATTERNING PROCESS

(75) Inventors: Hiroyuki Yasuda, Annaka (JP); Katsuya Takemura, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 13/556,422

(22) Filed: Jul. 24, 2012

(65) Prior Publication Data

US 2013/0026044 A1    Jan. 31, 2013

(30) Foreign Application Priority Data

Jul. 25, 2011   (JP) .................................. 2011-161860

(51) Int. Cl.
*G03F 7/004*        (2006.01)
*G03F 7/40*         (2006.01)
*G03F 7/039*        (2006.01)

(52) U.S. Cl.
CPC ............ *G03F 7/0392* (2013.01); *G03F 7/0397* (2013.01); *G03F 7/40* (2013.01); *Y10S 430/11* (2013.01)
USPC .......................... 430/270.1; 430/315; 430/909

(58) Field of Classification Search
USPC ................. 430/270.1, 326, 909, 315
See application file for complete search history.

(56) References Cited

U.S. PATENT DOCUMENTS

| 3,634,082 | A | 1/1972 | Christensen |
| 5,942,369 | A | 8/1999 | Ota et al. |
| 6,338,931 | B1 * | 1/2002 | Maeda et al. .................. 430/170 |
| 6,635,400 | B2 | 10/2003 | Kato et al. |
| 6,911,292 | B2 | 6/2005 | Furihata et al. |
| 6,939,662 | B2 * | 9/2005 | Mizutani et al. ........... 430/270.1 |
| 6,949,323 | B2 * | 9/2005 | Takeda et al. ............. 430/270.1 |
| 2007/0275320 | A1 * | 11/2007 | Washio et al. ............. 430/270.1 |
| 2012/0184101 | A1 * | 7/2012 | Yasuda et al. .................. 438/676 |

FOREIGN PATENT DOCUMENTS

| EP | 0 588 492 A1 | 3/1994 |
| EP | 1 818 722 A1 | 8/2007 |
| JP | 46-016049 B | 4/1971 |
| JP | 06-202332 A | 7/1994 |
| JP | 10-207057 A | 8/1998 |
| JP | 2002-006503 A | 1/2002 |
| JP | 2004-198915 A | 7/2004 |
| JP | 2004-198944 A | 7/2004 |
| JP | 2004-228434   * | 8/2004 |
| JP | 4403627 B2 | 1/2010 |

OTHER PUBLICATIONS

Machine translation of JP 2004-228434, published on Aug. 12, 2004.*
Extended European Search Report dated Nov. 9, 2012, issued in corresponding European Patent Application No. 12177870.8 (4 pages).

* cited by examiner

*Primary Examiner* — Anca Eoff
(74) *Attorney, Agent, or Firm* — Westerman, Hattori, Daniels & Adrian, LLP

(57) ABSTRACT

A chemically amplified positive resist composition is provided comprising an alkali-insoluble or substantially alkali-insoluble polymer having an acid labile group-protected acidic functional group, an alkyl vinyl ether polymer, a photoacid generator, and a benzotriazole compound in a solvent. The composition forms on a substrate a resist film of 5-100 μm thick which can be briefly developed to form a pattern at a high sensitivity and a high degree of removal or dissolution to bottom.

17 Claims, 1 Drawing Sheet

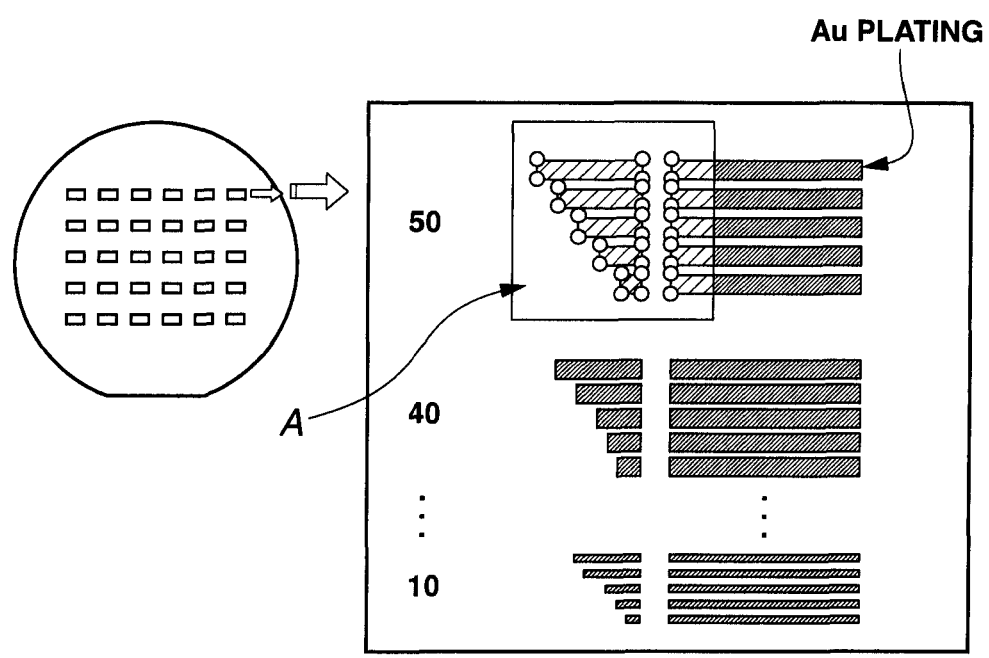

CHEMICALLY AMPLIFIED POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2011-161860 filed in Japan on Jul. 25, 2011, the entire contents of which are hereby incorporated by reference.

TECHNICAL FIELD

This invention relates to a chemically amplified positive resist composition which can be patterned by exposure to UV radiation having a wavelength of up to 500 nm (near and deep-UV regions), e.g., i- and g-lines, and a pattern forming process.

The resist composition is coated onto a substrate to form a relatively thick resist film of 5 to 100 μm thick which is exposed and developed to form a pattern. The composition has an improved sensitivity and allows for effective removal or dissolution near the substrate or at the pattern bottom. The development time can be reduced although a long time is otherwise required for the development of a thick resist film. While a chemically amplified positive resist composition containing a certain acid generator suffers from a problem that a footing or undercut phenomenon occurs when a resist pattern is formed on a metal substrate such as copper substrate, that is, the pattern profile is degraded, the invention overcomes the problem. When resist patterning is followed by electroplating or electroless plating to deposit a metal layer on the substrate, the resist pattern is resistant to deformation and cracking.

BACKGROUND ART

In harmony with the downsizing of electronic equipment, a rapid progress is recently made toward higher integration of LSIs and toward ASIC (application specific integrated circuits). For LSI mounting, multi-pin thin-film packaging is widely employed. Such multi-pin structures include protruding electrodes or solder bumps of at least 10 μm in height as the connecting terminal, while the technique for forming solder bumps is requisite. When bumps are formed on LSI by a plating technique, a photoresist material is used. While bumps of mushroom shape are formed using conventional thin film resist, such bump shape is difficult to increase the integration density by increasing the number of pins on LSI or reducing the pin spacing. It is then necessary to shape bumps with vertical sidewalls (or straight sidewalls) utilizing a thick film resist. The thick film photoresist subject to plating must fulfill many features including high sensitivity, vertical profile, and high resolution, as well as deformation resistance and crack resistance of the pattern during or after the plating step.

As the means for solving these problems, certain compositions are known in the art. For example, JP-A H10-207057 discloses a positive photoresist composition having an acrylic resin added for the main purpose of improving the plating resistance of bump-processing resist film. JP-B S46-16049 discloses an alkali-soluble photosensitive resin composition comprising a novolac resin, a naphthoquinonediazide-containing compound, and polyvinyl ether. Both the compositions are improved in crack resistance, but have a possibility that the pattern profile is degraded owing to the reduced contrast of resist film. Also a positive photoresist composition comprising a novolac resin and a hydrolyzate of an alkyl vinyl ether-maleic anhydride copolymer having a molecular weight of 20,000 to 80,000 is known from JP-A H06-202332. This system, however, is insufficient with respect to crack resistance during or after the plating step in the gold plating application.

On the other hand, since solder bumps must have a height of several tens of microns to about 100 microns (μm), the resist pattern formed therefor must accordingly have a depth of several tens of μm to about 100 μm. It is thus recommended that the resist material be coated as a very thick film having a thickness of several tens of μm to about 100 μm. This implies that the resist material adapted for solder bump pattern formation may have problems with respect to sensitivity and resist pattern profile. While positive resist compositions comprising a novolac resin and a naphthoquinonediazide-containing compound are commonly used in the art, as described in JP-B S46-16049 and JP-A 2004-198915, thick films thereof having a thickness of several tens of μm to about 100 μm are degraded in sensitivity, which reduces the productivity efficiency of pattern formation, causes the pattern profile to be tapered, and leads to profile deficiency against the requirement to shape bumps with vertical sidewalls (or straight sidewalls). For this reason, the solder bump-forming resist material requiring a film thickness of several tens of μm to about 100 μm prefers chemically amplified resist compositions to the positive resist compositions comprising a novolac resin and a naphthoquinonediazide-containing compound because a pattern with more vertical sidewalls can be formed at a higher sensitivity.

In connection with the chemically amplified resist composition used as the solder bump-forming resist material requiring a film thickness of several tens of μm to about 100 μm, when polyhydroxystyrene in which some phenolic hydroxyl groups are substituted with acetal groups as acid labile group is used as the base resin (JP-A 2002-006503), a problem arises that a long time is necessary for development because of the thick film. The long development time leads to drawbacks such as a time-consuming process and low production efficiency.

With respect to the electrolytic plating bath used in solder bump formation, strong acid based solder plating baths, known as high-speed plating baths, are often utilized for enhancing production efficiency. When the pattern of chemically amplified positive resist composition is immersed in the strong acid based solder plating bath, the strong acid system exposes the pattern to very rigorous conditions, giving rise to the problems that not only cracks generate as mentioned previously, but also the pattern swells and deforms. The base resin commonly used in chemically amplified positive resist compositions is polyhydroxystyrene in which some phenolic hydroxyl groups are substituted with acetal groups as acid labile group (JP-A 2002-006503). When a pattern of the chemically amplified positive resist composition having such acid labile group is immersed in a strong acid based solder plating bath, the acid labile group can be eliminated by reaction with the acid in the plating bath. Thus the pattern is locally made hydrophilic and progressively swollen. As a result, the pattern is deformed within a short time.

Although the chemically amplified positive resist composition is preferred as the solder bump-forming resist material, many problems remain unsolved including a long development time, and film swell and pattern deformation upon immersion in plating bath.

Another exemplary chemically amplified positive resist composition used as the solder bump-forming resist material is disclosed in JP 4403627 as a composition comprising a base resin having an acid labile group other than acetal group, the composition having improved crack resistance. The resin used therein includes units which undergo elimination reaction with an acid and become soluble in alkaline developer, for example, (meth)acrylate units having 1,1-dimethyl-3-oxobutyl and/or 2-benzyl-propan-2-yl as the acid labile group. These acid labile groups have the following characteristics. Now that the solder bump-forming resist composition is formed into a thick film, if a compound resulting from acid elimination has a boiling point of up to 20° C. under atmospheric pressure, it can gasify, remain within the film, and form large bubbles in the film, adversely affecting the pattern profile. For this reason, preference is given to the acid labile group which is acid eliminated to form a compound having a boiling point of at least 20° C. under atmospheric pressure. Allegedly the compounds resulting from acid elimination of the acid labile groups in the units of exemplary base resins have the characteristics.

The acid labile groups mentioned above are tertiary alkyl esters. Under conditions of the step of immersing in a strong acid based solder plating bath, the tertiary alkyl esters do not undergo reaction with the acid in the plating bath, as opposed to the acetal groups. These acid labile groups are characterized by stability and a least likelihood of pattern deformation.

However, the chemically amplified positive resist composition comprising a resin having a tertiary alkyl ester as acid labile group may fail to gain a high resolution in the lithography process of forming a resist pattern because the acid elimination reaction of the acid labile group is inferior to that of acetal groups. This detracts from the removal of resist material to the bottom of a pattern being formed, resulting in a pattern profile being tapered.

When the acid labile group has characteristics as described in JP 4403627, that is, the acid labile group is able to be acid eliminated to form a component having a boiling point of at least 20° C. under atmospheric pressure, a possibility that the compound resulting from acid elimination in the resist pattern undergoes secondary addition reaction with the polymer or other resist components or reverse reaction to generate the acid labile group again cannot be completely removed. For this reason, the resist material film which is to become alkali soluble after exposure and development is extremely reduced in alkali solubility, failing to gain a high resolution. If the compound resulting from acid elimination has a high boiling point or a large or bulky molecule, the secondary addition reaction or reverse reaction as pointed out above can take place significantly. The resist material becomes insolubilized and left where spaces must be formed via positive/negative reversal, that is, as positive tone. Inversely a phenomenon to form a pattern there or a problem to induce scum formation can take place. Since the film formed of the solder bump-forming resist material is as thick as several tens of μm to about 100 μm, there is a tendency that the secondary addition reaction or reverse reaction as pointed out above takes place.

Photoacid generators generally used in chemically amplified positive resist materials include organic acid generators of onium salt type and of non-onium salt type such as oxime sulfonate derivatives. When a chemically amplified positive resist film is patterned on a metal substrate such as copper substrate which is to be subjected to plating to form solder bumps, the acid generated by the acid generator may be deactivated by the influence from the substrate, or the acid generator itself may exhibit a quasi-decomposition behavior by the influence from the substrate. In this way, the acid generation function can be lost. The portion of the pattern which is located near the substrate is observed to be degraded, which is known as a footing profile or undercut profile that the pattern portion appears to bite into the substrate. The footing profile can be transferred to solder bumps near the substrate as cutouts, with a possibility that the pattern collapses. The undercut profile also degrades the profile of subsequently formed solder bumps. That is, the profile of the resist pattern is transferred to solder bumps, and footing of solder bumps is thus observed. Because of the footing, the size of solder bumps near the substrate deviates from the target value.

For the chemically amplified positive resist material used in the formation of solder bumps via a plating step, the selection of acid labile group is critical. It is critical to select an acid labile group which is stable against strong acid in the plating bath, which affords high reactivity with the acid generated by the acid generator so that acid elimination reaction may smoothly run, and thus displays a high resolution, and which does not detract from the high resolution performance since the elimination reaction does not entail secondary addition reaction or reverse reaction, when the relevant resist composition is subjected to the lithography pattern forming process. In addition, it is also important to seek for a resist composition from which a resist pattern can be formed on a metal substrate, typically copper substrate for solder bump formation, without any degradation like footing and undercut. It is urgently demanded to seek for an acid generator or to construct a resist material which avoids any degradation of the pattern profile by generation of bubbles or the like after acid elimination when subjected to the lithography pattern forming process.

CITATION LIST

Patent Document 1: JP-A H10-207057
Patent Document 2: JP-B S46-16049
Patent Document 3: JP-A H06-202332
Patent Document 4: JP-A 2004-198915
Patent Document 5: JP-A 2002-006503
Patent Document 6: JP 4403627

SUMMARY OF INVENTION

An object of the invention is to provide a chemically amplified positive resist composition useful as a thick film photoresist material subject to a subsequent plating step, which when lithographically processed to form a pattern, offers advantages including a high sensitivity, high resolution, vertical profile, and short development time, and avoids resist pattern profile degradation like footing and undercut on a metal substrate, typically copper substrate, and in which the pattern exhibits crack resistance and is free of deformation during or after the plating step; and a pattern forming process.

The invention pertains to a chemically amplified positive resist composition comprising (A) an organic solvent, (B) a base resin, and (C) a photoacid generator. The inventors have found that when (D) a specific benzotriazole compound is added thereto and a mixture of a polymer comprising recurring units represented by the general formula (4) defined below and having a Mw of 1,000 to 500,000 and a vinyl ether copolymer consisting of recurring units represented by the general formula (5) defined below and having a Mw of 10,000 to 500,000 is used as the base resin (B), the resulting composition has such advantages as a high sensitivity, high resolution, and vertical profile, enables to reduce the development time, and exhibits crack resistance during or after a subsequent plating step.

In one aspect, the invention provides a chemically amplified positive resist composition comprising (A) an organic solvent, (B) a base resin, (C) a photoacid generator, and (D) a benzotriazole compound. The benzotriazole compound (D) has the general formula (1) or (2).

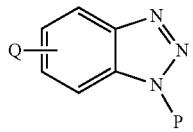

Herein P is hydrogen, hydroxyl, a substituted or unsubstituted alkyl, substituted or unsubstituted phenyl, sulfonic acid or derivative thereof, or —Z—Y, Z is an alkylene, cycloalkylene or alkylene ether group which may be substituted with carboxyl, Y is a hydroxyl, alkoxy, carboxyl or dialkylamino group, Q is hydrogen, halogen, hydroxyl, alkyl, alkoxy group or an organic group having the formula (3):

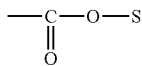

wherein S is a $C_1$-$C_{12}$ alkyl or aldehyde group.

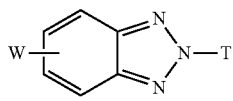

Herein T is hydrogen, hydroxyl, a substituted or unsubstituted alkyl, or substituted or unsubstituted phenyl, and W is hydrogen, halogen, hydroxyl, alkyl or alkoxy.

The base resin (B) comprises a polymer comprising recurring units represented by the general formula (4) and having a weight average molecular weight of 1,000 to 500,000 and a vinyl ether copolymer consisting of recurring units represented by the general formula (5) and having a weight average molecular weight of 10,000 to 500,000.

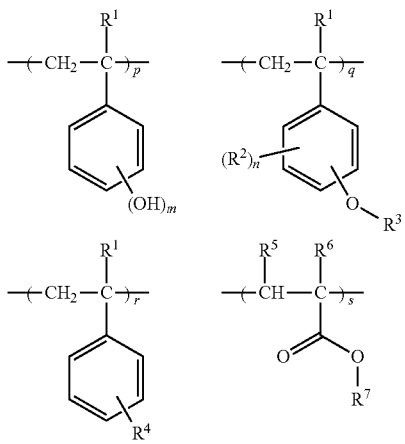

Herein $R^1$ is hydrogen, hydroxyl, straight alkyl, branched alkyl, halogen or trifluoromethyl, $R^2$ is hydrogen, hydroxyl, halogen or trifluoromethyl, $R^3$ is a $C_4$-$C_{12}$ tertiary alkyl group, $R^4$ is hydrogen, an acid labile group, or ditrifluoromethylhydroxyl, $R^5$ is hydrogen or methyl, $R^6$ is hydrogen, methyl, alkoxycarbonyl, cyano, halogen or trifluoromethyl, $R^7$ is $C_4$-$C_{30}$ alkyl, n is an integer of 1 to 4, m is 0 or an integer of 1 to 5, p, r and s each are 0 or a positive number, q is a positive number, and p+q+r+s=1,

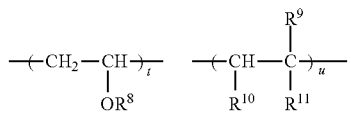

Herein $R^8$ is hydrogen or a straight or branched $C_1$-$C_{12}$ alkyl group, $R^9$ is hydrogen or methyl, $R^{10}$ is hydrogen or an organic group of the general formula (6):

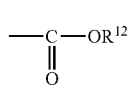

wherein $R^{12}$ is hydrogen or methyl, $R^{11}$ is an organic group of formula (6), nitrile or halogen, t and u are numbers in the range: t+u=1 and 0≤u≤0.5.

In a preferred embodiment, the benzotriazole compound (D) is present in an amount of 0.01 to 10 parts by weight relative to 100 parts by weight of the base resin (B).

In a preferred embodiment, the polymer comprising recurring units represented by formula (4) included in the base resin (B) is a polymer comprising recurring units represented by the general formula (7) and having a weight average molecular weight of 50,000 to 100,000,

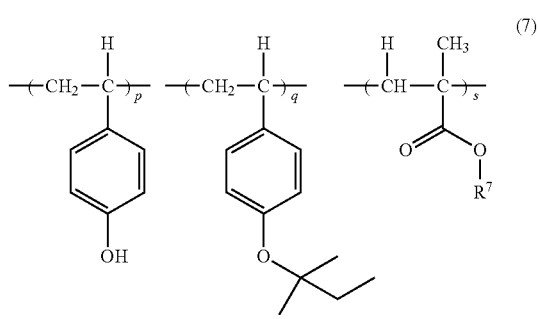

wherein $R^7$ is as defined above, 0.4≤p≤0.8, 0<q≤0.5, 0<s≤0.3, and p+q+s=1.

The resist composition may further comprise (E) a dissolution inhibitor and/or (F) a basic compound.

In another aspect, the invention provides a pattern forming process comprising the steps of:

(i) coating the resist composition defined above onto a substrate and prebaking to form a resist film, (ii) exposing the resist film to UV radiation having a wavelength of up to 500 nm through a photomask, and (iii) optionally baking, and developing with a developer to form a resist pattern.

In a preferred embodiment, the substrate is a substrate having a conductive layer on its surface, and the process further comprises, after the developing step (iii), (iv) subjecting the resist pattern-bearing substrate to ashing with an oxygen plasma for thereby removing any resist residue on the pattern and rendering the resist film surface hydrophilic, (v) performing electroplating or electroless plating using the resist pattern as a mold, for thereby depositing a metal pattern on the conductive substrate to a predetermined thickness, and (vi) removing the resist component which has served as the mold for depositing the metal pattern, from the substrate.

Typically, the resist film has a thickness of 5 to 100 μm.

Advantageous Effects of Invention

The chemically amplified positive resist composition of the invention is coated onto a substrate to form a relatively thick resist film of 5 to 100 μm thick, which can be developed to form a pattern at a high sensitivity and a high degree of removal or dissolution to pattern bottom near the substrate. Even though the resist film is as thick as 5 to 100 μm thick, the development time is short. The resist pattern is devoid of any profile degradation like footing and undercut on a metal substrate, typically copper substrate. When electrolytic plating or electroless plating is carried out, after resist patterning, to deposit a metal plating layer on the pattern-bearing substrate, the resist pattern is fully resistant to a strong acid based plating bath and avoids crack generation.

BRIEF DESCRIPTION OF DRAWINGS

FIG. 1 illustrates resist patterns, depicting an area where cracks are observed.

DESCRIPTION OF EMBODIMENTS

The terms "a" and "an" herein do not denote a limitation of quantity, but rather denote the presence of at least one of the referenced item.

"Optional" or "optionally" means that the subsequently described event or circumstance may or may not occur, and that the description includes instances where the event occurs and instances where it does not.

As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking One embodiment of the invention is a chemically amplified positive resist composition comprising (A) an organic solvent, (B) a base resin, (C) a photoacid generator, and (D) a benzotriazole compound. The base resin (B) comprises, in combination, a polymer comprising recurring units represented by the general formula (4) defined below and having a weight average molecular weight of 1,000 to 500,000 and a vinyl ether (co)polymer consisting of recurring units represented by the general formula (5) defined below and having a weight average molecular weight of 10,000 to 500,000. The polymers of formulae (4) and (5) are sometimes referred to as first and second polymers, respectively.

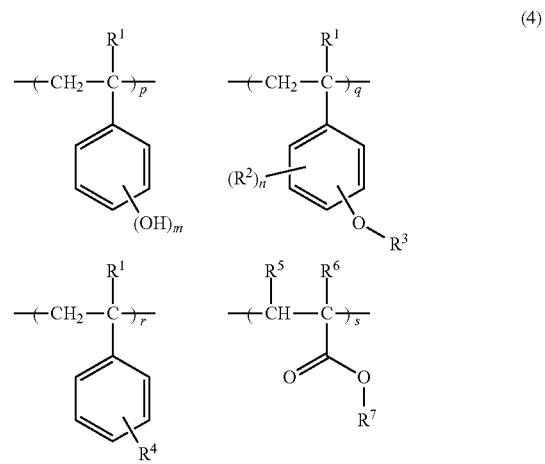

Herein $R^1$ is hydrogen, hydroxyl, straight alkyl, branched alkyl, halogen or trifluoromethyl, $R^2$ is hydrogen, hydroxyl, halogen or trifluoromethyl, $R^3$ is a $C_4$-$C_{12}$ tertiary alkyl group, $R^4$ is hydrogen, an acid labile group, or ditrifluoromethylhydroxyl, $R^5$ is hydrogen or methyl, $R^6$ is hydrogen, methyl, alkoxycarbonyl, cyano, halogen or trifluoromethyl, $R^7$ is $C_4$-$C_{30}$ alkyl, n is an integer of 1 to 4, m is 0 or an integer of 1 to 5, p, r and s each are 0 or a positive number, q is a positive number, and p+q+r+s=1.

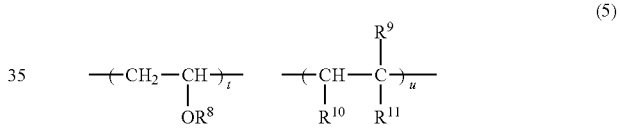

Herein $R^8$ is hydrogen or a straight or branched $C_1$-$C_{12}$ alkyl group, $R^9$ is hydrogen or methyl, $R^{10}$ is hydrogen or an organic group of the general formula (6):

wherein $R^{12}$ is hydrogen or methyl, $R^{11}$ is an organic group of formula (6), nitrile or halogen, t and u are numbers in the range: t+u=1 and 0≤u≤0.5.

The straight or branched alkyl groups represented by $R^1$ are typically those of 1 to 6 carbon atoms, preferably 1 to 4 carbon atoms, for example, methyl, ethyl, propyl, isopropyl, n-butyl, isobutyl, and tert-butyl. Examples of the tertiary alkyl group represented by $R^3$ include t-butyl and ethyldimethylmethyl.

In formula (4), $R^4$ is hydrogen, an acid labile group, or ditrifluoromethylhydroxyl. When $R^4$ is an acid labile group, the acid labile group is selected from a variety of such groups, preferably from among groups of the following formulae (8) and (9), straight, branched or cyclic tertiary alkoxy groups of 4 to 20 carbon atoms, trialkylsiloxy groups in which each alkyl moiety has 1 to 6 carbon atoms, oxoalkoxy groups of 4 to 20 carbon atoms, tetrahydropyranyloxy, tetrahydrofuranyloxy and trialkylsiloxy groups.

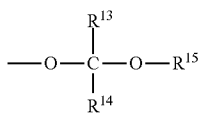
(8)

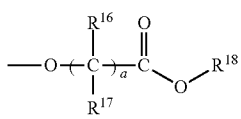
(9)

Herein $R^{13}$, $R^{14}$, $R^{15}$, $R^{16}$, and $R^{17}$ are each independently hydrogen or a straight or branched $C_1$-$C_8$ alkyl group. A pair of $R^{13}$ and $R^{14}$, $R^{13}$ and $R^{15}$, or $R^{14}$ and $R^{15}$ may bond together to form a ring with the carbon and oxygen atoms to which they are attached, and each of participant $R^{13}$, $R^{14}$, and $R^{15}$ is a straight or branched $C_1$-$C_{18}$ alkylene group when they form a ring. $R^{18}$ is a straight, branched or cyclic $C_4$-$C_{40}$ alkyl group, and "a" is 0 or an integer of 1 to 4.

Suitable acid labile groups of formula (8) include methoxyethoxy, ethoxyethoxy, n-propoxyethoxy, isopropoxyethoxy, n-butoxyethoxy, isobutoxyethoxy, tert-butoxyethoxy, cyclohexyloxyethoxy, methoxypropoxy, ethoxypropoxy, 1-methoxy-1-methylethoxy, and 1-ethoxy-1-methylethoxy. Suitable acid labile groups of formula (9) include tert-butoxycarbonyloxy, tert-butoxycarbonylmethyloxy, ethylcyclopentyloxycarbonyloxy, ethylcyclohexyloxycarbonyloxy, and methylcyclopentyloxycarbonyloxy. Suitable trialkylsiloxy groups include those in which each alkyl moiety has 1 to 6 carbon atoms, typically trimethylsiloxy.

In formula (4), $R^1$, $R^2$, $R^3$ and $R^6$ may be halogen. Exemplary halogens are fluorine, chlorine and bromine. When $R^6$ is an alkoxycarbonyl group, its alkoxy moiety is preferably of 4 to 12 carbon atoms.

$R^7$ is an alkyl group which may be tertiary alkyl. Tertiary alkyl may be selected from a variety of such groups, preferably those of the general formulae (10) and (11).

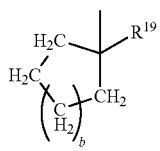
(10)

Herein $R^{19}$ is methyl, ethyl, isopropyl, cyclohexyl, cyclopentyl, vinyl, acetyl, phenyl, benzyl or cyano, and b is an integer of 0 to 3.

The cyclic alkyl groups of formula (10) are preferably 5- or 6-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

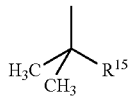
(11)

Herein $R^{15}$ is methyl, ethyl, isopropyl, cyclohexyl, cyclopentyl, vinyl, phenyl, benzyl or cyano.

Examples of the group of formula (II) include t-butyl, 1-vinyldimethyl, 1-benzyldimethyl, 1-phenyldimethyl, and 1-cyanodimethyl.

As recurring units (s) containing $R^7$ in formula (4), units of the following formulae are also preferred.

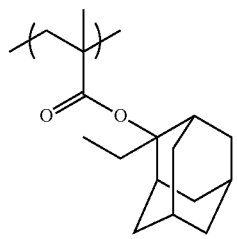
(11)-1

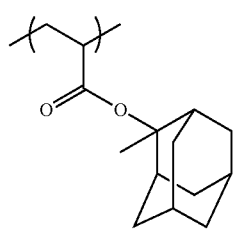
(11)-2

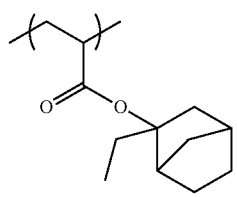
(11)-3

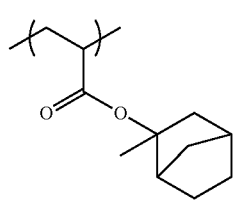
(11)-4

In formula (4), p, r and s each are 0 or a positive number, and q is a positive number. With properties of resist material taken into account, these subscripts preferably satisfy the following range:
0<q≤0.5, more preferably 0<q≤0.3,
0≤p≤0.8, more preferably 0.3≤p≤0.8,
0≤r≤0.35,
0≤s≤0.35, more preferably 0<s≤0.3, provided p+q+r+s=1.

In case q=0, indicating that a polymer of formula (4) does not contain the relevant unit (q), a contrast of alkali dissolution rate is lost, and resolution is worsened. If a proportion of p is too high, the unexposed region of film may have too high an alkali dissolution rate. By properly selecting the values of p, q, r and s within the above ranges, the size and profile of a pattern can be controlled as desired.

In order that the chemically amplified positive resist composition have a high sensitivity and be able to reduce the development time, it is preferred that s in formula (4) be not equal to 0. In a case where a phenolic hydroxyl group is protected with an acid labile group, the alkali soluble functional group resulting from elimination of that acid labile group is, needless to say, the phenolic hydroxyl group. On the other hand, the substituent group $R^7$ in recurring unit (s) is a tertiary alkyl group which is an acid labile group, and the alkali soluble functional group resulting from elimination of $R^7$ is —COOH group. When the dissolution rate of phenolic hydroxyl group and —COOH group in alkaline developer is compared, the dissolution rate of —COOH group is overwhelmingly high. Then the chemically amplified positive resist composition comprising a base resin containing recurring units (s) has a high sensitivity and is able to reduce the development time.

In the polymer of formula (4), the following two-component polymer (copolymer) of formula (4)-1, three-component polymers (terpolymers) of formula (4)-2, (4)-3 and (4)-4, and four-component polymer (tetramer) of formula (4)-5 are preferably used.

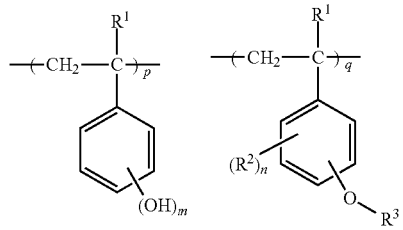
(4)-1 wherein $0.5 \leq p \leq 0.8$, $0.2 \leq q \leq 0.5$, and $p+q=1$.

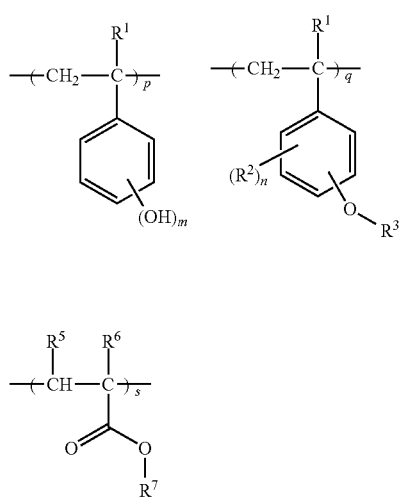
(4)-2 wherein $0.4 \leq p \leq 0.8$, $0 < q \leq 0.5$, $0 < s \leq 0.3$, and $p+q+s=1$.

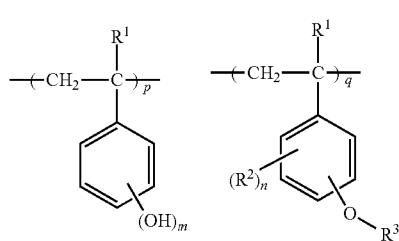
(4)-3

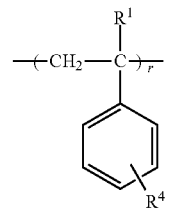
-continued wherein $0.4 \leq p \leq 0.8$, $0 < q \leq 0.5$, $0.1 \leq r \leq 0.5$, and $p+q+r=1$.

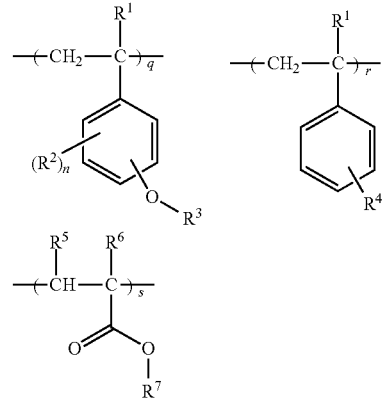
(4)-4 wherein $0 < q \leq 0.5$, $0.2 \leq r < 0.5$, $0 < s \leq 0.3$, and $p+r+s=1$.

(4)-5 wherein $0 < q \leq 0.5$, $0.3 \leq p \leq 0.8$, $0.1 \leq r \leq 0.5$, $0 < s \leq 0.3$, and $p+q+r+s=1$.

The polymer of formula (4) should have a weight average molecular weight (Mw) of 1,000 to 500,000, preferably 2,000 to 300,000, as measured by GPC versus polystyrene standards. With too low a Mw, the resist composition is less heat resistant. With too high a Mw, the resist composition is reduced in alkali dissolution and tends to a footing phenomenon after pattern formation.

The polymer comprising recurring units of formula (4) is preferably a polymer comprising recurring units represented by the general formula (7), more preferably the general formula (12), and having a Mw of 5,000 to 100,000.

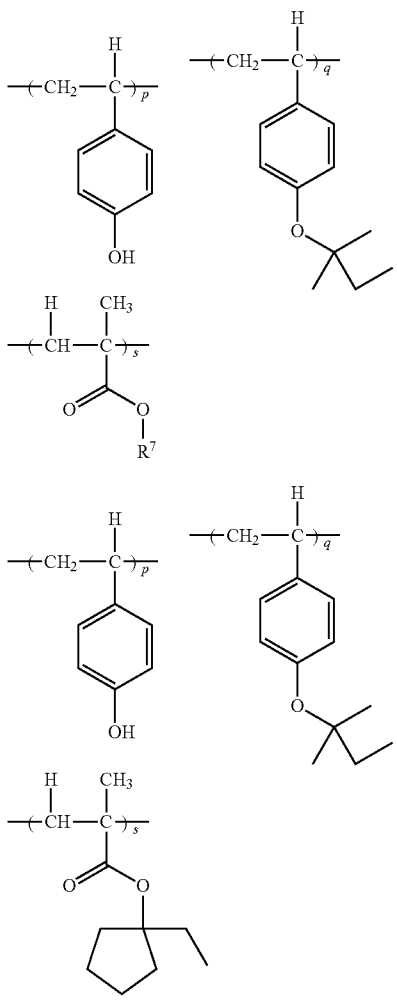

Herein $R^7$ is as defined above, $0.4 \leq p \leq 0.8$, $0 < q \leq 0.5$, $0 < s \leq 0.3$, and $p+q+s=1$.

If a multi-component polymer has a broad molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer of formula (4) should preferably have a narrow dispersity (Mw/Mn) of 1.0 to 3.0, especially 1.0 to 2.0, in order to provide a resist composition suitable for micropatterning to a small feature size.

The polymer of formula (4) may be synthesized by any desired method, for example, by dissolving acetoxystyrene, (meth)acrylic acid tertiary ester, and amyloxystyrene monomers in an organic solvent, adding a radical initiator thereto, and effecting heat polymerization. The resulting polymer is subjected to alkaline hydrolysis in an organic solvent, whereby the acetoxy group is deprotected, obtaining a ternary copolymer or a polymer of three components: hydroxystyrene, (meth)acrylic acid tertiary ester, and amyloxystyrene. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. For alkaline hydrolysis, ammonia water, triethylamine or the like may be used as the base, the reaction temperature may be −20° C. to 100° C., preferably 0° C. to 60° C., and the reaction time may be 0.2 to 100 hours, preferably 0.5 to 20 hours.

After the resulting polymer having a phenolic hydroxyl group is isolated, an acid labile group of formula (8) or (9) may be introduced into the phenolic hydroxyl group. For example, the polymer having a phenolic hydroxyl group may be reacted with a halogenated alkyl ether compound in the presence of a base, thereby obtaining a polymer in which the phenolic hydroxyl group is, in part, protected with an alkoxyalkyl group.

In the protection step, the reaction medium is preferably an aprotic polar solvent such as acetonitrile, acetone, dimethylformamide, dimethylacetamide, tetrahydrofuran or dimethyl sulfoxide, which may be used alone or in admixture. Preferred examples of the base include triethylamine, pyridine, diisopropylamine, and potassium carbonate. The base is preferably used in an amount of at least 10 mol % based on the moles of total phenolic hydroxyl groups on the polymer to be reacted. The reaction temperature may be −50° C. to 100° C., preferably 0° C. to 60° C., and the reaction time may be 0.5 to 100 hours, preferably 1 to 20 hours.

The introduction of an acid labile group of formula (9) is possible with an alternative method, that is, by reacting the polymer with a dialkyl dicarbonate or alkoxycarbonylalkyl halide in a solvent in the presence of a base. Examples of the dialkyl dicarbonate include di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, and tert-butoxycarbonylethyl chloride. The reaction medium is preferably an aprotic polar solvent such as acetonitrile, acetone, dimethylformamide, dimethylacetamide, tetrahydrofuran or dimethyl sulfoxide, which may be used alone or in admixture. Preferred examples of the base include triethylamine, pyridine, imidazole, diisopropylamine, and potassium carbonate. The base is preferably used in an amount of at least 10 mol % based on the moles of total phenolic hydroxyl groups on the polymer to be reacted. The reaction temperature may be 0° C. to 100° C., preferably 0° C. to 60° C., and the reaction time may be 0.2 to 100 hours, preferably 1 to 10 hours.

Notably, the synthesis method of the polymer is not limited to the foregoing.

In combination with the first polymer, a second polymer is used as the base resin. The second polymer is a vinyl ether (co)polymer consisting of recurring units represented by the general formula (5) and having a weight average molecular weight of 10,000 to 500,000.

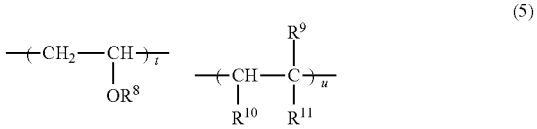

Herein $R^8$ is hydrogen or a straight or branched $C_1$-$C_{12}$ alkyl group, $R^9$ is hydrogen or methyl, $R^{10}$ is hydrogen or an organic group of the general formula (6):

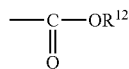

(6)

wherein $R^{12}$ is hydrogen or methyl, $R^{11}$ is an organic group of formula (6), nitrile or halogen, t and u are numbers in the range: t+u=1 and 0≤u≤0.5.

Preferred examples of $R^8$ include hydrogen, methyl and ethyl.

In formula (5), t and u are numbers in the range: t+u=1 and 0≤u≤0.5, preferably 0≤u≤0.3.

In case u>0, when $R^{10}$ is an organic group of formula (6) and $R^{12}$ is hydrogen, $R^{11}$ may be similarly an organic group of formula (6). Where $R^{12}$ is methyl, a polymer of formula (5) may be exemplified by an alkyl vinyl ether-monomethyl maleate copolymer, which can be advantageously used as the base resin which is effective for preventing cracking in the step of depositing a metal plating layer on the pattern of the inventive resist composition.

The vinyl ether copolymer of formula (5) should have a weight average molecular weight (Mw) of 10,000 to 500,000, preferably 15,000 to 300,000, as measured by GPC versus polystyrene standards. With a Mw of less than 10,000, the polymer is less resistant to cracking during or after the plating step. With a Mw in excess of 500,000, the resist composition is reduced in resolution and sensitivity.

The second polymer of formula (5), typically methyl vinyl ether-monoalkyl maleate copolymer is combined with the first polymer of formula (4). Preferably 2 to 30 parts, more preferably 5 to 20 parts by weight of the second polymer is blended with 100 parts by weight of the first polymer. A resist film of a polymer blend containing less than 2 parts of the second polymer may not withstand the stress associated with metal growth during the plating step after thick film resist pattern formation, allowing the pattern to crack. More than 30 parts of the second polymer may invite a risk of scum generation after development.

On use of the positive resist material, the base resin (B) is dissolved in the organic solvent (A) to form a solution. Any organic solvents may be used as long as they have a sufficient solubility to the base resin and ensure effective coating. Suitable organic solvents include cellosolve solvents such as methyl cellosolve, ethyl cellosolve, methyl cellosolve acetate, and ethyl cellosolve acetate; propylene glycol solvents such as propylene glycol monomethyl ether, propylene glycol monobutyl ether, propylene glycol monomethyl ether acetate, propylene glycol dimethyl ether, and propylene glycol monoethyl ether acetate; ester solvents such as butyl acetate, amyl acetate, methyl lactate, ethyl lactate, ethyl 3-methoxypropionate, and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; highly polar solvents such as N,N-dimethylformamide and N-methylpyrrolidone, and mixtures thereof.

An amount of the solvent used is desirably 1 to 20 times, more desirably 1 to 15 times the amount of total solids (including the base resin) on a weight basis.

The PAG (C) may be any compound capable of generating an acid upon exposure to high-energy radiation. Suitable PAGs include sulfonium salt, iodonium salt, sulfonyldiazomethane, and N-sulfonyloxyimide acid generators. Exemplary acid generators are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl) sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations include aryl iodonium cations such as diphenyliodonium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis (cyclohexylsulfonyl)diazomethane, bis (perfluoroisopropylsulfonyl)diazomethane, bis (phenylsulfonyl)diazomethane, bis(4-methylphenylsulfonyl) diazomethane, bis(2,4-dimethylphenylsulfonyl) diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo [2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, or methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted by trifluoromethyl.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Suitable O-arylsulfonyloxime compounds and O-alkylsulfonyloxime compounds (oxime sulfonates) include photoacid generators in the form of glyoxime derivatives; photoacid generators in the form of oxime sulfonates with a long conjugated system separated by thiophene or cyclohexadiene; oxime sulfonates having an electron withdrawing group such as trifluoromethyl incorporated for increased stability; oxime sulfonates using phenylacetonitrile or substituted acetonitrile derivatives; and bisoxime sulfonates.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedionedioxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(4-fluorobenzenesulfonyl)-nioxime, bis-O-(4-(trifluoromethyl)benzenesulfonyl)-nioxime, and bis-O-(xylenesulfonyl)-nioxime. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl) difluoromethanesulfonate, and 4-oxo-1-adamantyloxycarbonyldifluoromethanesulfonate.

Photoacid generators in the form of oxime sulfonates with a long conjugated system separated by thiophene or cyclohexadiene include (5-(p-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(p-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, (5-(4-(p-toluenesulfonyloxy)benzenesulfonyl)oxyimino-5H-thiophen-2-ylidene)phenylacetonitrile, and (5-(2,5-bis(p-toluenesulfonyloxy)benzenesulfonyl)oxyimino-5H-thiophen-2-ylidene)phenylacetonitrile.

Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Suitable oxime sulfonates having an electron withdrawing group such as trifluoromethyl incorporated for increased stability include 2,2,2-trifluoro-1-phenyl-ethanone O-(methylsulfonyl)oxime, 2,2,2-trifluoro-1-phenyl-ethanone O-(10-camphorsulfonyl)oxime, 2,2,2-trifluoro-1-phenylethanone O-(4-methoxybenzenesulfonyl)oxime, 2,2,2-trifluoro-1-phenylethanone O-(1-naphthylsulfonyl)oxime, 2,2,2-trifluoro-1-phenylethanone O-(2-naphthylsulfonyl)oxime, 2,2,2-trifluoro-1-phenylethanone O-(2,4,6-trimethylphenylsulfonyl)oxime, 2,2,2-trifluoro-1-(4-methylphenyl)ethanone O-(10-camphorsulfonyl) oxime, 2,2,2-trifluoro-1-(4-methylphenyl)ethanone O-(methylsulfonyl)oxime, 2,2,2-trifluoro-1-(2-methylphenyl)ethanone O-(10-camphorsulfonyl)oxime, 2,2,2-trifluoro-1-(2,4-dimethylphenyl)ethanone O-(10-camphorsulfonyl)oxime, 2,2,2-trifluoro-1-(2,4-dimethylphenyl)ethanone O-(1-naphthylsulfonyl)oxime, 2,2,2-trifluoro-1-(2,4-dimethylphenyl)-ethanone O-(2-naphthylsulfonyl)oxime, 2,2,2-trifluoro-1-(2,4,6-trimethylphenyl)ethanone O-(10-camphorsulfonyl)oxime, 2,2,2-trifluoro-1-(2,4,6-trimethylphenyl)ethanone O-(1-naphthylsulfonyl)oxime, 2,2,2-trifluoro-1-(2,4,6-trimethylphenyl)ethanone O-(2-naphthylsulfonyl)oxime, 2,2,2-trifluoro-1-(4-methoxyphenyl)ethanone O-(methylsulfonyl)oxime, 2,2,2-trifluoro-1-(4-methylthiophenyl)-ethanone O-(methylsulfonyl)oxime, 2,2,2-trifluoro-1-(3,4-dimethoxyphenyl)ethanone O-(methylsulfonyl)oxime, 2,2,2-trifluoro-1-(4-methoxyphenyl)ethanone O-(4-methylphenylsulfonyl)oxime, 2,2,2-trifluoro-1-(4-methoxyphenyl)ethanone O-(4-methoxyphenylsulfonyl)oxime, 2,2,2-trifluoro-1-(4-methoxyphenyl)ethanone O-(4-dodecylphenylsulfonyl)oxime, 2,2,2-trifluoro-1-(4-methoxyphenyl)ethanone O-(octylsulfonyl)oxime, 2,2,2-trifluoro-1-(4-thiomethylphenyl)ethanone O-(4-methoxyphenylsulfonyl)oxime, 2,2,2-trifluoro-1-(4-thiomethylphenyl)ethanone O-(4-dodecylphenylsulfonyl)oxime, 2,2,2-trifluoro-1-(4-thiomethylphenyl)ethanone O-(octylsulfonyl)oxime, 2,2,2-trifluoro-1-(4-thiomethylphenyl)ethanone O-(2-naphthylsulfonyl)oxime, 2,2,2-trifluoro-1-(2-methylphenyl)ethanone O-(methylsulfonyl)oxime, 2,2,2-trifluoro-1-(4-methylphenyl)ethanone O-(phenylsulfonyl)oxime, 2,2,2-trifluoro-1-(4-chlorophenyl)ethanone O-(phenylsulfonyl)oxime, 2,2,3,3,4,4,4-heptafluoro-1-phenylbutanone O-(10-camphorsulfonyl)oxime, 2,2,2-trifluoro-1-(1-naphthyl)ethanone O-(methylsulfonyl)oxime, 2,2,2-trifluoro-1-(2-naphthyl)ethanone O-(methylsulfonyl)oxime, 2,2,2-trifluoro-1-(4-benzylphenyl)ethanone O-(methylsulfonyl)oxime, 2,2,2-trifluoro-1-(4-(phenyl-1,4-dioxa-but-1-yl)phenyl)ethanone O-(methylsulfonyl)oxime, 2,2,2-trifluoro-1-(1-naphthyl)ethanone O-(propylsulfonyl)oxime, 2,2,2-trifluoro-1-(2-naphthyl)ethanone O-(propylsulfonyl)oxime, 2,2,2-trifluoro-1-(4-benzylphenyl)ethanone O-(propylsulfonyl)oxime, 2,2,2-trifluoro-1-(4-methylsulfonylphenyl)ethanone O-(propylsulfonyl)oxime, 2,2,2-trifluoro-1-(4-methylsulfonyloxyphenyl)ethanone O-(propylsulfonyl)oxime, 2,2,2-trifluoro-1-(4-methylcarbonyloxyphenyl)ethanone O-(propylsulfonyl)oxime, 2,2,2-trifluoro-1-(6H,7H-5,8-dioxonaphth-2-yl)ethanone O-(propylsulfonyl)oxime, 2,2,2-trifluoro-1-(4-methoxycarbonylmethoxyphenyl)ethanone O-(propylsulfonyl)oxime, 2,2,2-trifluoro-1-(4-methoxycarbonyl)-(4-amino-1-oxa-pent-1-yl)phenyl)ethanone O-(propylsulfonyl)oxime, 2,2,2-trifluoro-1-(3,5-dimethyl-4-ethoxyphenyl)ethanone O-(propylsulfonyl)oxime, 2,2,2-trifluoro-1-(4-benzyloxyphenyl)ethanone O-(propylsulfonyl)oxime, 2,2,2-trifluoro-1-(2-thiophenyl)ethanone O-(propylsulfonate)oxime, and 2,2,2-trifluoro-1-(1-dioxathiophen-2-yl)ethanone O-(propylsulfonate)oxime; 2,2,2-trifluoro-1-(4-(3-(4-(2,2,2-trifluoro-1-(trifluoromethanesulfonyloxyimino)ethyl)phenoxy)propoxy)phenyl)ethanone O-(trifluoromethanesulfonyl)oxime, 2,2,2-trifluoro-1-(4-(3-(4-(2,2,2-trifluoro-1-(1-propanesulfonyloxyimino)ethyl)phenoxy)propoxy)phenyl)ethanone O-(propylsulfonyl)oxime, 2,2,2-trifluoro-1-(4-(3-(4-(2,2,2-trifluoro-1-(1-butanesulfonyloxyimino)ethyl)phenoxy)propoxy)phenyl)ethanone O-(butylsulfonyl)oxime, 2,2,2-trifluoro-1-(4-(3-(4-(2,2,2-trifluoro-1-(4-(4-methylphenylsulfonyloxy)phenylsulfonyloxyimino)ethyl)phenoxy)propoxy)phenyl)ethanone O-(4-(4-methylphenylsulfonyloxy)phenylsulfonyl)oxime, and 2,2,2-trifluoro-1-(4-(3-(4-(2,2,2-trifluoro-1-(2,5-bis(4-methylphenylsulfonyloxy)benzenesulfonyloxy)phenylsulfonyloxyimino)ethyl)phenoxy)propoxy)phenyl)ethanone O-(2,5-bis(4-methylphenylsulfonyloxy)benzenesulfonyloxy)phenylsulfonyl)oxime.

Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Also included are oxime sulfonates having the formula (Ox-1):

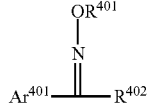

(Ox-1)

wherein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is substituted or unsubstituted aromatic or hetero-aromatic group.

Examples include 2-[2,2,3,3,4,4,5,5-octafluoro-1-(nonafluorobutylsulfonyloxyimino)-pentyl]fluorene, 2-[2,2,3,3,4,4-pentafluoro-1-(nonafluorobutylsulfonyloxyimino)-butyl]fluorene, 2-[2,2,3,3,4,4,5,5,6,6-decafluoro-1-(nonafluorobutylsulfonyloxyimino)-hexyl]fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl.

Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Suitable oxime sulfonate generators using substituted acetonitrile derivatives include α-(p-toluenesulfonyloxyimino)phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Suitable bisoxime sulfonates include bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc.

Among these, the preferred PAGs are sulfonium salts, bissulfonyldiazomethanes, N-sulfonyloxyimides, and sulfonyloxime compounds.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid.

The PAG (C) is added to the chemically amplified positive resist composition in an amount of 0.5 to 20 parts, preferably 1 to 10 parts by weight per 100 parts by weight of the base resin. The PAG may be used alone or in admixture of two or more. The transmittance of the resist film can be controlled by using a PAG having a low transmittance at the exposure wavelength and adjusting the amount of the PAG added.

When a chemically amplified positive resist material is patterned on a metal substrate such as copper substrate, the pattern is observed to have a degraded profile, which is known as a footing or undercut profile. The degraded profile of resist pattern can interfere with the formation of solder bump pattern and the profile thereof. That is, the footing profile can be transferred to solder bumps near the substrate as cutouts, with a possibility that the pattern collapses. The undercut profile also degrades the profile of solder bumps because a footing is transferred to solder bumps. Because of the footing, the size of solder bumps near the substrate deviates from the target value.

Particularly when a sulfonium salt is selected among the aforementioned acid generators, a resist pattern on a copper substrate may be sometimes observed to have a footing profile. On the other hand, when a sulfonyloxime compound is used, a resist pattern on a copper substrate may be often observed to have an undercut profile.

Seeking for a resist material which when a resist pattern is formed on a metal substrate such as copper substrate which is to be subjected to plating to form solder bumps, prevents the pattern profile from degradation such as footing or undercut, the inventors have found that the addition of (D) a benzotriazole compound having the general formula (1) or (2) to the chemically amplified positive resist material is effective for avoiding the occurrence of a footing or undercut profile on the metal substrate.

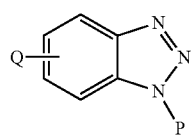
(1)

Herein P is hydrogen, hydroxyl, a substituted or unsubstituted alkyl group, preferably $C_1$-$C_{12}$ alkyl, a substituted or unsubstituted phenyl group, a sulfonic acid group or derivative thereof, or —Z—Y wherein Z is a $C_2$-$C_{12}$ alkylene group, cycloalkylene group or alkylene ether group, in which the alkylene is preferably of $C_2$-$C_{12}$, and which may be substituted with carboxyl, and Y is a hydroxyl, alkoxy, preferably $C_2$-$C_4$ alkoxy, carboxyl or dialkylamino group. Q is hydrogen, halogen, hydroxyl, alkyl group, preferably $C_1$-$C_{12}$ alkyl, alkoxy group, preferably $C_1$-$C_{12}$ alkoxy, or an organic group having the formula (3):

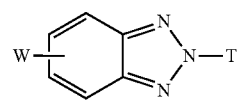
(3)

wherein S is a $C_1$-$C_{12}$ alkyl or aldehyde group.

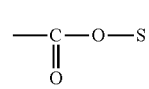
(2)

Herein T is hydrogen, hydroxyl, a substituted or unsubstituted alkyl, preferably $C_1$-$C_{12}$ alkyl, or a substituted or unsubstituted phenyl. W is hydrogen, halogen, hydroxyl, an alkyl group, preferably $C_1$-$C_{12}$ alkyl, or an alkoxy group, preferably $C_1$-$C_{12}$ alkoxy.

When P and T stand for substituted alkyl groups, suitable substituent radicals are hydroxyl, nitrile or the like. When P and T stand for substituted phenyl groups, suitable substituent radicals are hydroxyl, $C_1$-$C_{12}$ alkyl, $C_1$-$C_{12}$ alkoxy or the like. Suitable sulfonic acid derivatives include salts of sulfonic acid, especially alkali metal salts of sulfonic acid.

Examples of the benzotriazole compound having formula (1) or (2) include benzotriazole, 1-hydroxybenzotriazole, 1-methylbenzotriazole, 1-hydroxymethylbenzotriazole, 1-ethylbenzotriazole, 1-(1'-hydroxyethyl)benzotriazole, 1-(2'-hydroxyethyl)benzotriazole, 1-propylbenzotriazole, 1-(1'-hydroxypropyl)benzotriazole, 1-(2'-hydroxypropyl)benzotriazole, 1-(3'-hydroxypropyl)benzotriazole, 4-hydroxy-1H-benzotriazole, 5-methyl-1H-benzotriazole, benzotriazole-5-carboxylic acid, methyl benzotriazole-5-carboxylate, ethyl benzotriazole-5-carboxylate, t-butyl benzotriazole-5-carboxylate, cyclopentylethyl benzotriazole-5-carboxylate, 1H-benzotriazole-4-sulfonic acid, 1H-benzotriazole-1-acetonitrile, 1H-benzotriazole-1-carboxyaldehyde, 2-methyl-2H-benzotriazole, 2-ethyl-2H-benzotriazole, 2-(2'-hydroxy)benzotriazole, (2'-hydroxy-5'-methylphenyl)benzotriazole, 2-(2'-hydroxy-5'-ethylphenyl) benzotriazole, 2-(2'-hydroxy-5'-isopropylphenyl) benzotriazole, and 2-(2H-benzotriazol-2-yl)-4-tert-butylphenol.

Of these, preferred are benzotriazole, 1-hydroxybenzotriazole, 1-methylbenzotriazole, 5-methyl-1H-benzotriazole, methyl benzotriazole-5-carboxylate, and 2-(2H-benzotriazol-2-yl)-4-tert-butylphenol.

The benzotriazole compounds may be used alone or in admixture of two or more. Typically the benzotriazole compound is added in an amount of 0.01 to 10 parts, preferably 0.05 to 5 parts by weight per 100 parts by weight of the base resin (B). Less than 0.01 pbw of the benzotriazole compound may be less effective for preventing the resist pattern from degradation whereas more than 10 pbw may achieve little extra effect despite an increased amount or adversely affect sensitivity and film retention.

In one preferred embodiment, the resist composition further contains (E) a dissolution inhibitor. The preferred dissolution inhibitor is a compound having a weight average molecular weight of 100 to 1,000 and containing two or more phenolic hydroxyl groups in the molecule wherein the hydrogen of the phenolic hydroxyl group is substituted by an acid labile group in an average proportion of 10 to 100 mol %. The compound has a Mw of 100 to 1,000, preferably 150 to 800. The dissolution inhibitor, which may be used alone or in admixture, is added in an amount of 0 to 50 parts, preferably 5 to 50 parts, and more preferably 10 to 30 parts by weight per 100 parts by weight of the base resin. Too small an amount of the dissolution inhibitor may fail to achieve a resolution improvement whereas too large an amount tends to invite a pattern film loss and a resolution lowering.

Illustrative, non-limiting, examples of the dissolution inhibitors which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4'-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

In one preferred embodiment, the resist composition further contains (F) a basic compound. The basic compound (F) is preferably a compound capable of suppressing the rate of diffusion when the acid generated by the PAG diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds (F) include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_a(YY)_{3-a} \quad \text{(B)-1}$$

In the formula, "a" is equal to 1, 2 or 3; YY is independently hydrogen or a straight, branched or cyclic alkyl group of 1 to 20 carbon atoms which may contain a hydroxyl or ether moiety; and X is independently selected from groups of the following general formulas (X)-1 to (X)-3, and two or three X may bond together to form a ring with the nitrogen atom to which they are attached.

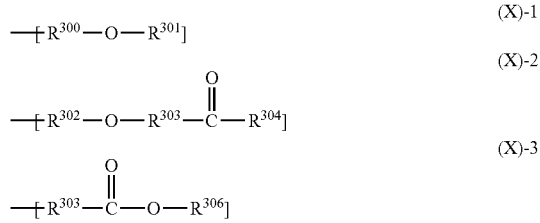

In the formulas, $R^{300}$, $R^{302}$ and $R^{305}$ are independently a straight or branched $C_1$-$C_4$ alkylene group. $R^{301}$ and $R^{304}$ are independently hydrogen, or a straight, branched or cyclic $C_1$-$C_{20}$ alkyl group which may contain at least one hydroxyl, ether or ester moiety or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl, ether or ester moiety or lactone ring.

Illustrative examples of the basic compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl) amine, tris(2-valeryloxyethyl)amine, tris(2-pivaloyloxyethyl)amine, N,N-bis(2-acetoxyethyl)-2-(acetoxyacetoxy) ethylamine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis [2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl) amine, tris(ethoxycarbonylmethyl)amine, N-butyl-bis (methoxycarbonylmethyl)amine, N-hexyl-bis (methoxycarbonylmethyl)amine, and β-(diethylamino)-δ-valerolactone.

The basic compounds may be used alone or in admixture of two or more. The basic compound (F) is preferably formulated in an amount of 0 to 2 parts, and especially 0.01 to 1 part by weight per 100 parts by weight of the base resin. More than 2 parts of the basic compound may result in too low a sensitivity.

If desired, any additives such as leveling agents, dyes, pigments and surfactants may be added to the resist composition.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, Surflon S-381, Surfynol E1004, KH-20 and KH-30 are preferred. These surfactants may be used alone or in admixture.

In the resist composition, the surfactant is formulated in an amount of up to 2 parts, and preferably up to 1 part by weight per 100 parts by weight of the base resin.

In the resist composition, other optional components may be added, for example, a light absorbing substance for reducing diffuse reflection from the substrate, a compound having 1,2-naphthoquinonediazidesulfonyl group in the molecule, and a dissolution accelerator. Such optional components may be added in conventional amounts as long as they do not compromise the benefits of the invention.

Suitable light absorbing substances include azo compounds such as 2-benzeneazo-4-methylphenol and 4-hydroxy-4'-dimethylaminoazobenzene, and curcumin.

The compounds having 1,2-naphthoquinonediazidesulfonyl group in the molecule include compounds having in the molecule a 1,2-naphthoquinonediazidesulfonyl group represented by the general formula (13) or (14).

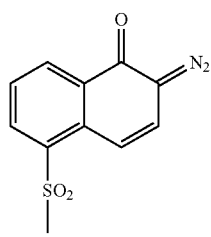

(13)

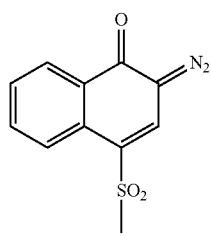

(14)

Examples of the parent compound into which a 1,2-naphthoquinonediazidesulfonyl group is introduced include tri- or tetrahydroxybenzophenone, ballast molecules having a phenolic hydroxyl group as represented by the general formula (15), and novolac resins comprising recurring units of the following formula (20) and having a Mw of 2,000 to 20,000, preferably 3,000 to 10,000.

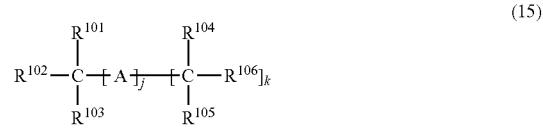

(15)

Herein $R^{101}$ to $R^{106}$ are each independently hydrogen, methyl, a group of formula (16), or a group of formula (17), j is an integer of 0 to 2, k is an integer of 0 to 2, with the proviso that j is 1 or 2 when k=0. When k is 0 and j is 1, A is hydrogen, methyl or a group of formula (16). When k is 0 and j is 2, one A is methylene or a group of formula (18), and the other A is hydrogen, methyl or a group of formula (16). When k is 1, A is methylene or a group of formula (18). When k is 2 and j is 1, A is methine or a group of formula (19). When j is 2, one A is methylene or a group of formula (18), and the other A is methine or a group of formula (19).

(16)

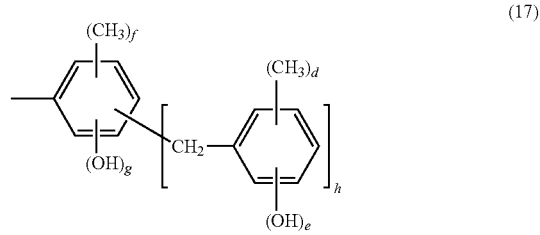

(17)

(18)

(19)

The subscripts d, e, f, g, h, v, and w each are an integer of 0 to 3, satisfying d+e≤5, f+g≤4, and v+w≤3.

The low nuclear compound (or ballast molecule) of formula (15) is preferably designed such that the number of benzene rings is 2 to 20, more preferably 2 to 10, and even more preferably 3 to 6 benzene rings, and a ratio of the number of phenolic hydroxyl groups to the number of benzene rings is from 0.5/1 to 2.5/1, more preferably from 0.7 to 2.0, and even more preferably from 0.8 to 1.5.

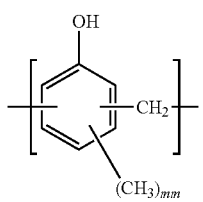
(20)

Herein, mm is an integer of 0 to 3.

The novolac resin of formula (20) may be synthesized by carrying out condensation reaction of a phenol having the following formula (21) with an aldehyde by a standard method.

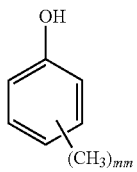
(21)

Herein, mm is an integer of 0 to 3.

Examples of the phenol having formula (21) include o-cresol, m-cresol, p-cresol, and 3,5-xylenol, which may be used alone or in admixture. Examples of the aldehyde include formaldehyde, paraformaldehyde, acetaldehyde, and benzaldehyde, with formaldehyde being preferred.

The phenol of formula (21) and the aldehyde are preferably combined in a molar ratio of 0.2/1 to 2/1, more preferably 0.3 to 2.

The preferred method of introducing a 1,2-naphthoquinonediazidesulfonyl group into the parent compound is by dehydrochlorination condensation reaction of 1,2-naphthoquinonediazidesulfonyl chloride with phenolic hydroxyl group in the presence of a base catalyst. When the parent compound is a ballast molecule of formula (15) or tri- or tetrahydroxybenzophenone, the hydrogen of phenolic hydroxyl group is preferably substituted by 1,2-naphthoquinonediazidesulfonyl in a proportion of 10 to 100 mol %, more preferably 50 to 100 mol %. When the parent compound is a novolac resin of formula (10), the hydrogen of phenolic hydroxyl group is preferably substituted by 1,2-naphthoquinonediazidesulfonyl in a proportion of 2 to 50 mol %, more preferably 3 to 27 mol %.

The compound having a 1,2-naphthoquinonediazidesulfonyl group in the molecule is preferably added in an amount of 0.1 to 15 parts, more preferably 0.5 to 10 parts by weight to 80 parts by weight of the base resin. Less than 0.1 part of the compound may be ineffective for improving the resolution of the resist composition whereas more than 15 parts may adversely affect the sensitivity.

Typically the dissolution accelerator is a low nuclear compound of formula (15), defined above, in which the number of benzene rings is 2 to 20, more preferably 2 to 10, and even more preferably 3 to 6 benzene rings, and a ratio of the number of phenolic hydroxyl groups to the number of benzene rings is from 0.5/1 to 2.5/1, more preferably from 0.7 to 2.0, and even more preferably from 0.8 to 1.5. Examples of the low nuclear compound are shown below as (E-1) to (E-43).

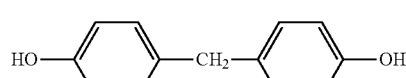
(E-1)

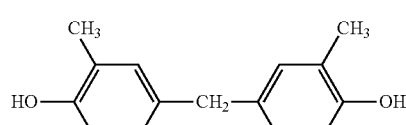
(E-2)

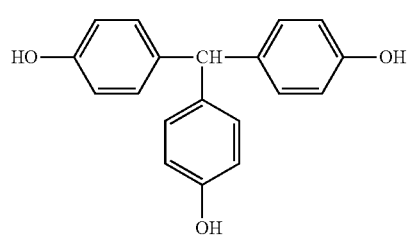
(E-3)

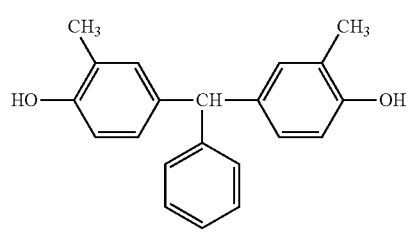
(E-4)

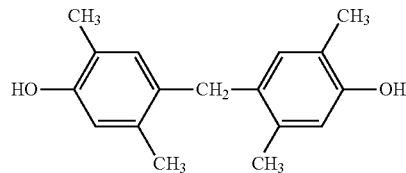
(E-5)

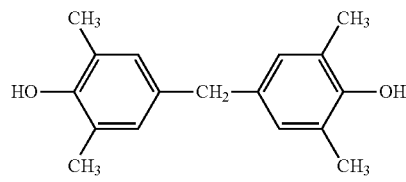
(E-6)

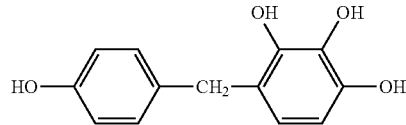
(E-7)

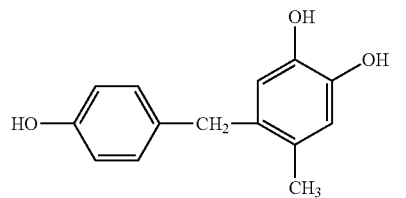
(E-8)

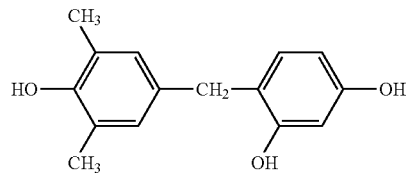
(E-9)

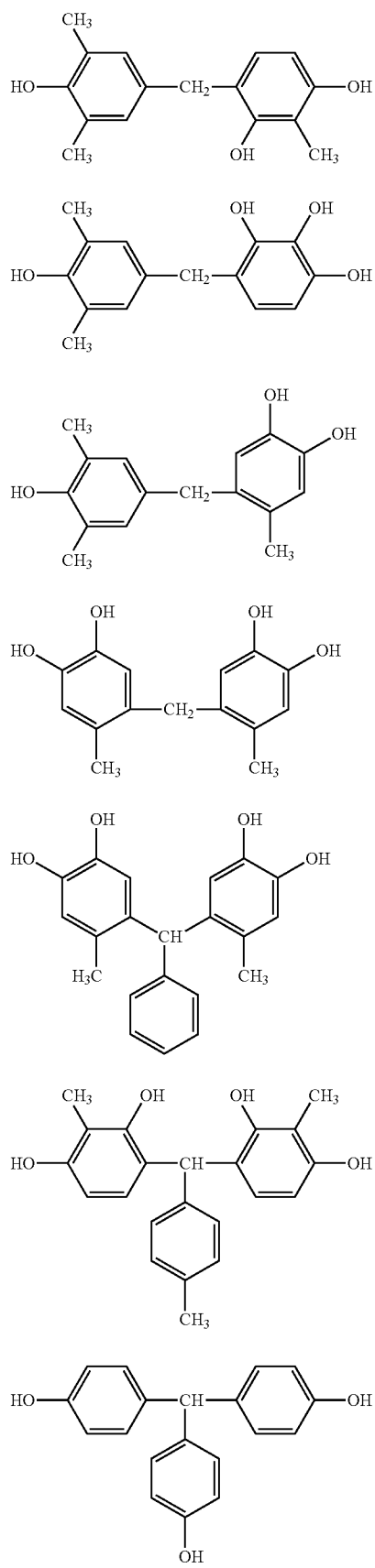
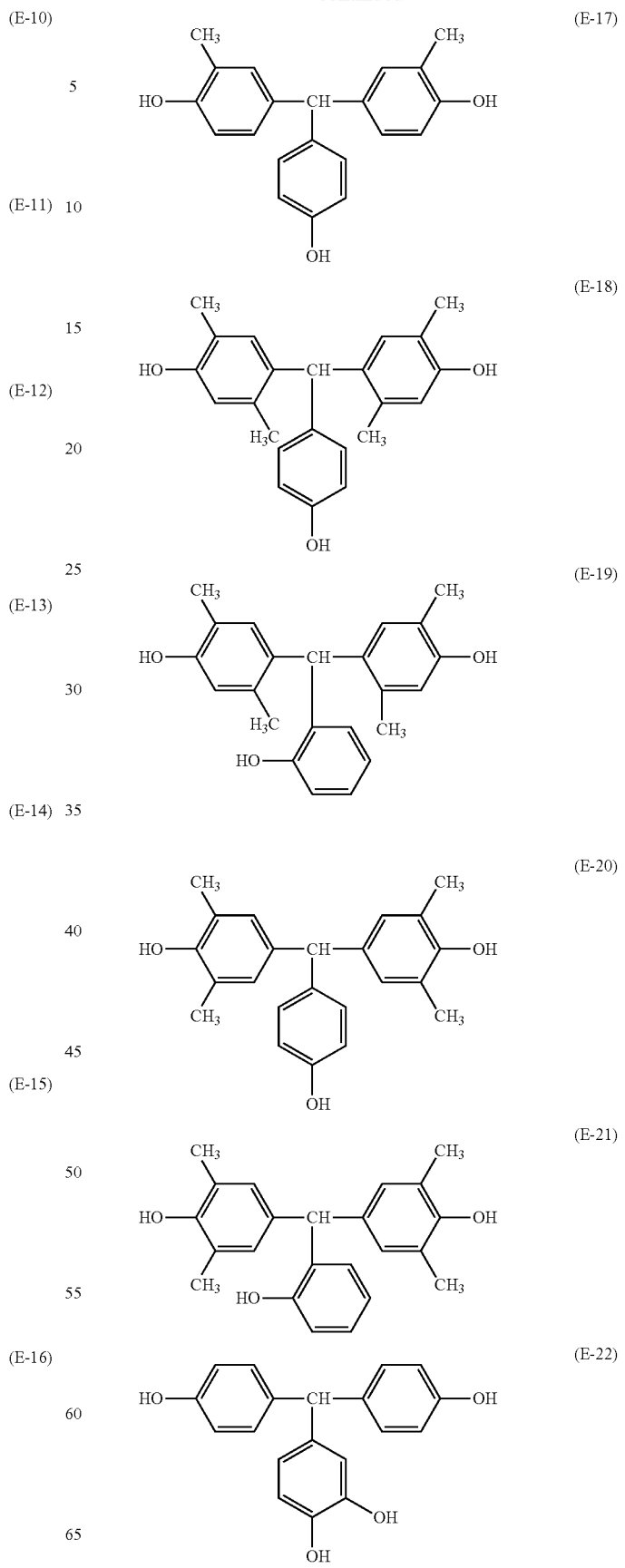

(E-23) 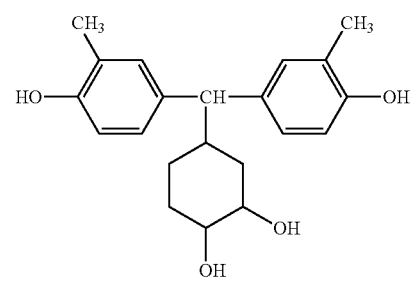
(E-24) 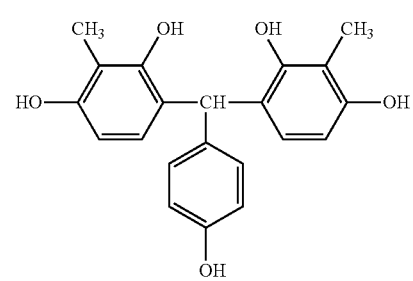
(E-25) 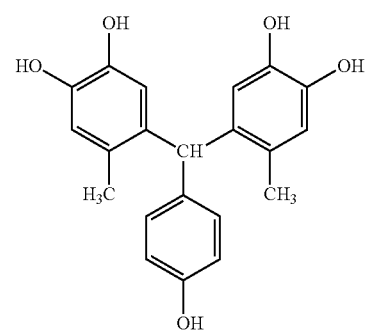
(E-26) 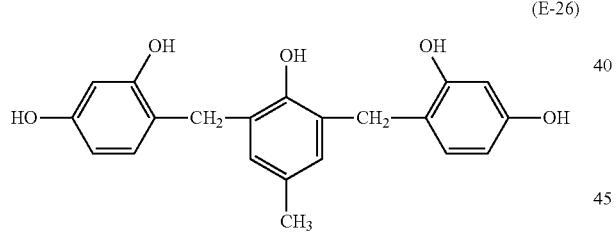
(E-27) 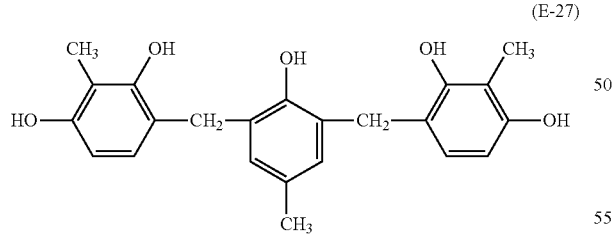
(E-28) 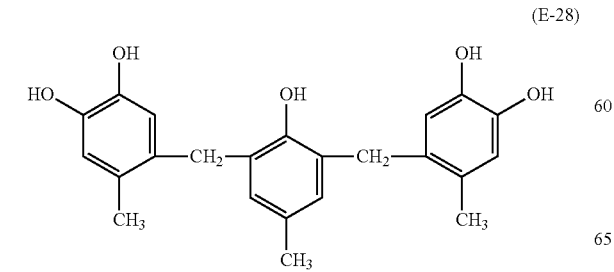
(E-29) 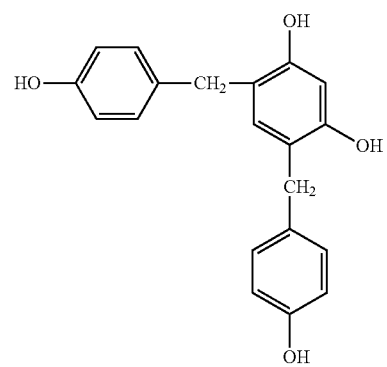
(E-30) 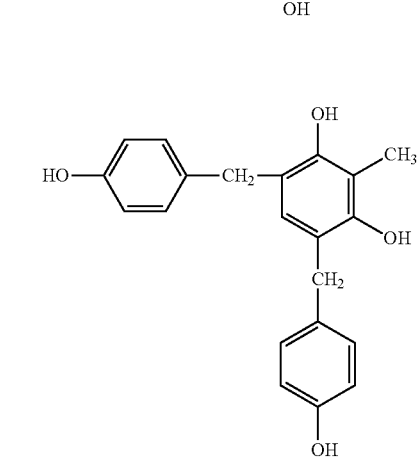
(E-31) 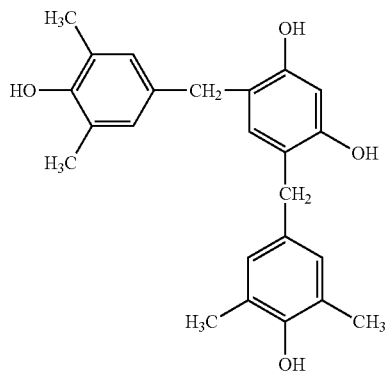
(E-32) 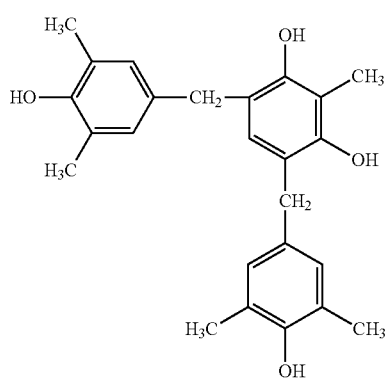

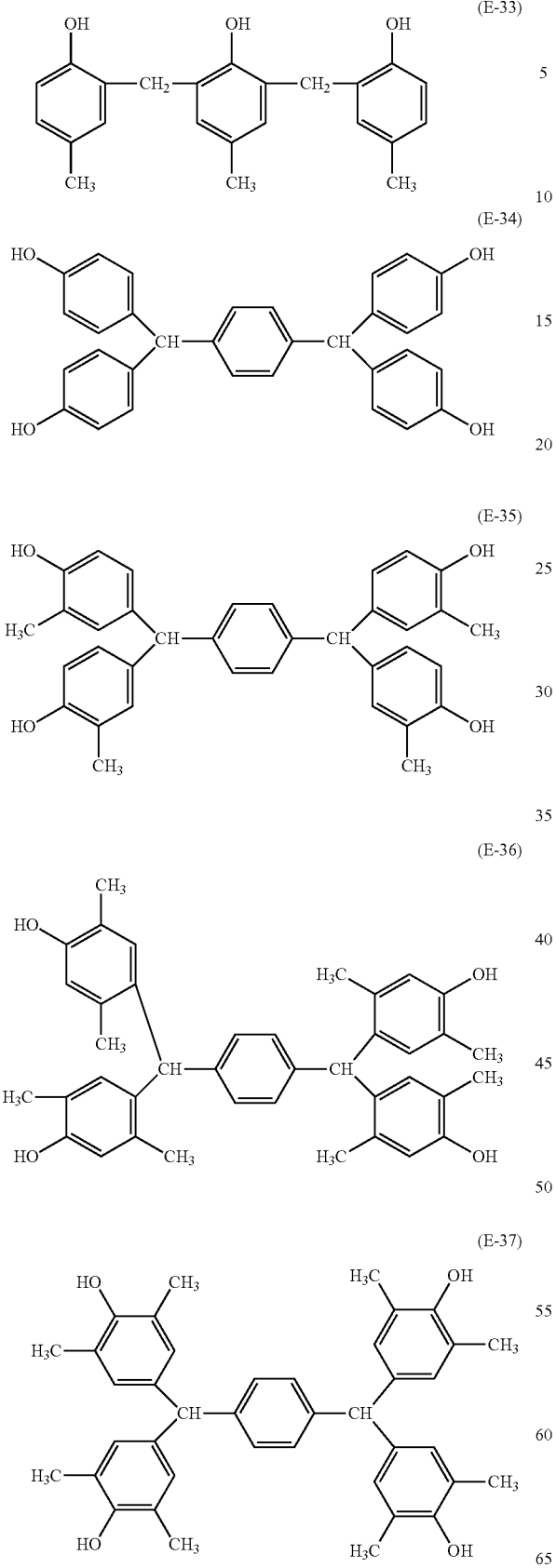

-continued

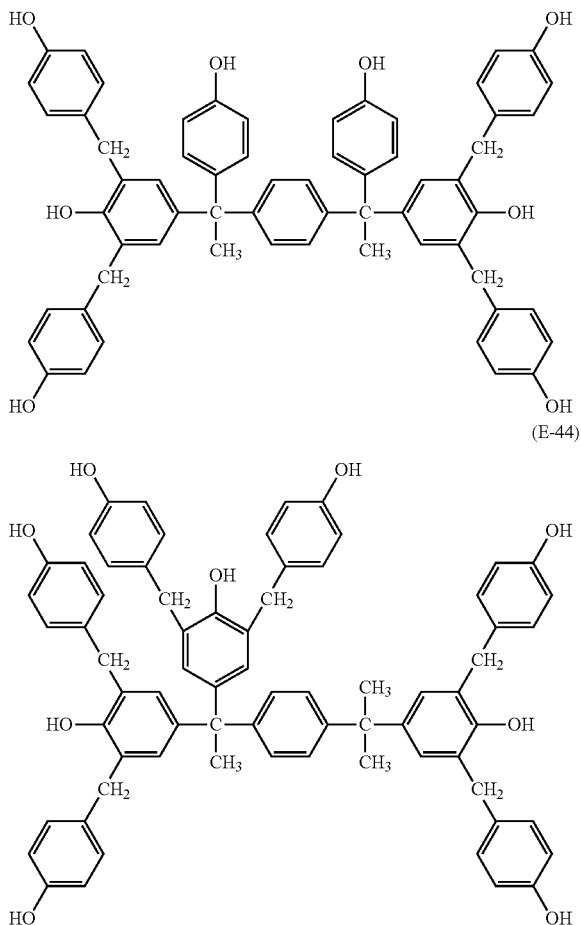

(E-43)

(E-44)

The dissolution accelerator, which may be used alone or in admixture, is preferably added in an amount of 0 to 10 parts, more preferably 0.05 to 5 parts by weight to 80 parts by weight of the base resin. More than 10 parts of the dissolution accelerator may adversely affect resolution and heat resistance.

Process

The positive resist composition of the invention may be used to form a pattern by any well-known lithography processes. For example, the resist composition is applied onto a substrate by suitable coating techniques, typically spin coating. The substrate may be a silicon wafer or a substrate having an electroconductive layer on its surface, for example, a substrate having a metal film of gold, silver, copper, nickel or the like formed by evaporation or plating. The coating is prebaked at a temperature of 80 to 130° C. for 50 to 600 seconds to form a resist film having a thickness of 5 to 100 μm, preferably 10 to 80 μm, more preferably 20 to 80 μm, and most preferably 30 to 70 μm. Through a mask having a desired pattern held above the resist film, the resist film is then exposed to high-energy radiation having a wavelength of up to 500 nm, such as i-line or g-line. The exposure dose is preferably in the range of about 1 to 5,000 mJ/cm², more preferably about 100 to 2,000 mJ/cm². If desired, the film may be baked (PEB) on a hot plate at 60 to 150° C. for 1 to 10 minutes, preferably 80 to 120° C. for 1 to 5 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.5 to 20 minutes, preferably 1 to 10 minutes by conventional techniques such as dip, puddle or spray development. In this way, a desired resist pattern is formed on the substrate. After the development, post-bake may be effected at 50 to 100° C. for 10 to 600 seconds if desired.

Next, a metal pattern is formed on the resist pattern-bearing substrate. Specifically, electroplating or electroless plating may be carried out to form a metal pattern on the substrate. Prior to plating, plasma ashing treatment with oxygen gas is preferably carried out using non-ionizing radiation in order to decompose away the resist residue. The plasma treatment may be carried out by any well-known techniques. Examples of the metal to be plated include Au, Ag, Cu, Fe, Ni and the like. The metal film preferably has a thickness of 5 to 100 μm, more preferably 10 to 70 μm, and even more preferably 10 to 60 μm.

In the case of electroplating, a metal film may be deposited in a plating bath containing a metal ion and a mineral acid (e.g., nitric acid, sulfuric acid, hydrochloric acid or hydrofluoric acid) by conducting electric current at a current density of 0.5 to 20 A/dm² for about 0.5 minute to 3 hours.

The electroless plating may be either displacement plating or reduction plating. The substrate is immersed in a commonly used plating bath containing a metal salt (e.g., sulfite, thiosulfate or chloride), a complexing agent, a reducing agent, and the like, at 5 to 80° C.

Optional additives such as well-known surfactants may be added to the electroplating and electroless plating baths. Not only single layer plating, but also multilayer plating by a combination of electroplating and electroless plating are acceptable.

The resulting plating layer may be heat treated if desired. The resist is removed using a suitable solvent, leaving the metal pattern-bearing substrate which is ready for use in the intended application.

EXAMPLE

Examples of the invention are given below by way of illustration and not by way of limitation.

Examples 1 to 18

A resist solution was prepared by selecting two polymers (Polymers 1 to 6 having recurring units identified below) as base resin, an acid generator (PAG-1 or PAG-2), a basic compound (Amine 1), a benzotriazole compound (B-1 to B-4), a dissolution inhibitor (D-1), and a surfactant in accordance with the formulation shown in Table 1, dissolving them in propylene glycol monomethyl ether acetate (PGMEA), and filtering through a membrane filter having a pore size of 1.0 μm. The resist solution was spin coated onto a substrate (which was a 6-inch silicon wafer having copper deposited thereon by sputtering), and soft baked on a hot plate under the conditions shown in Table 2 to form a resist film having a thickness of 50.0 μm. It is noted that the film thickness was measured by a spectrometric film thickness measurement system Lambda Ace VM1200 by Dainippon Screen Mfg. Co., Ltd.

Comparative Examples 1 to 9

A resist solution was prepared as in Examples aside from omitting the benzotriazole compound. The resist solution was spin coated onto a substrate (which was a 6-inch silicon wafer having copper deposited thereon by sputtering), and soft baked on a hot plate under the conditions shown in Table 2 to form a resist film having a thickness of 50.0 μm.

Polymer 1

(Polymer-1)

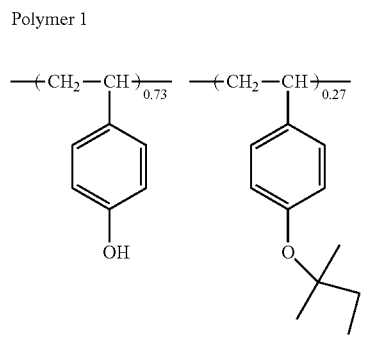

Mw = 7,400
Mw/Mn = 1.05

Polymer 2

(Polymer-2)

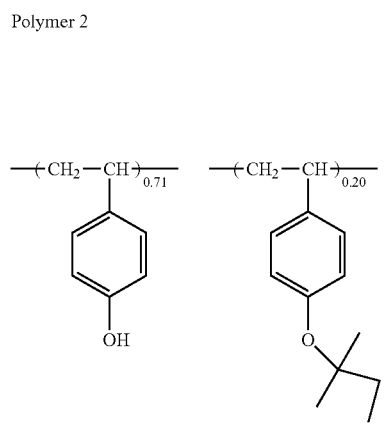

Polymer 3

(Polymer-3)

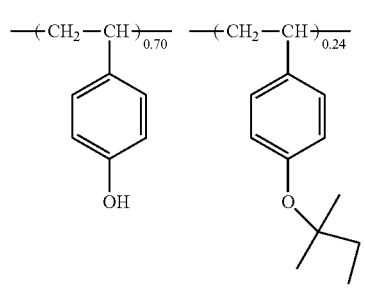

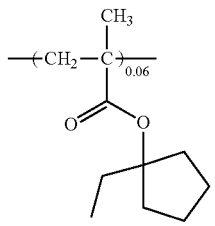

Mw = 15,000
Mw/Mn = 1.95

Polymer 4

(Polymer-4)

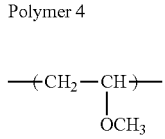

Mw = 80,000
Mw/Mn = 4.44

Polymer 5

(Polymer-5)

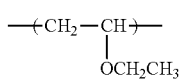

Mw = 124,000
Mw/Mn = 5.10

Polymer 6

(Polymer-6)

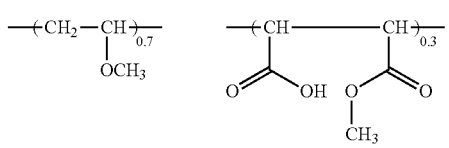

methyl vinyl ether-monomethyl maleate copolymer
Mw = 200,000

PAG-1

(PAG-1)

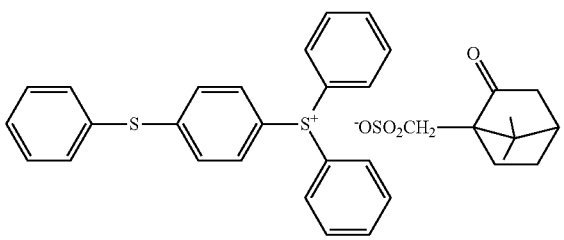

PAG-2

(PAG-2)

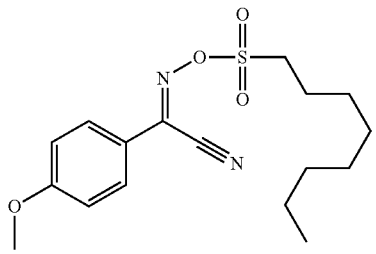

Benzotriazole compound B-1, B-2, B-3 and B-4

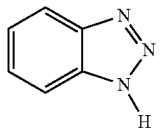
(B-1)

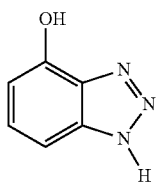
(B-2)

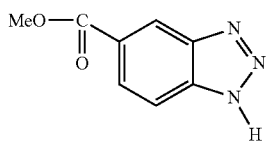
(B-3)

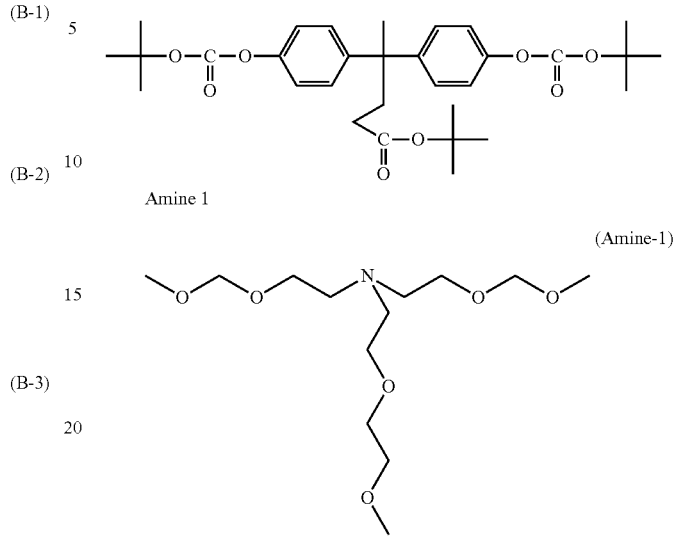

Dissolution inhibitor D-1

(D-1)

Amine 1

(Amine-1)

TABLE 1

| | | Base resin | | PAG | Benzotriazole compound | Basic compound | Dissolution inhibitor | Solvent |
|---|---|---|---|---|---|---|---|---|
| Example | 1 | Polymer 1 (70) | Polymer 4 (10) | PAG-1 (1.5) | B-1 (0.05) | — | — | PGMEA (95) |
| | 2 | Polymer 2 (70) | Polymer 4 (10) | PAG-1 (1.5) | B-1 (0.05) | — | — | PGMEA (95) |
| | 3 | Polymer 3 (70) | Polymer 4 (10) | PAG-1 (1.5) | B-1 (0.05) | — | — | PGMEA (95) |
| | 4 | Polymer 2 (70) | Polymer 5 (10) | PAG-1 (1.5) | B-1 (0.05) | — | — | PGMEA (95) |
| | 5 | Polymer 2 (70) | Polymer 5 (10) | PAG-1 (1.5) | B-1 (0.05) | Amine-1 (0.1) | — | PGMEA (95) |
| | 6 | Polymer 2 (70) | Polymer 6 (10) | PAG-1 (1.5) | B-1 (0.05) | — | — | PGMEA (95) |
| | 7 | Polymer 2 (70) | Polymer 6 (10) | PAG-1 (1.5) | B-1 (0.1) | — | — | PGMEA (95) |
| | 8 | Polymer 2 (70) | Polymer 6 (10) | PAG-1 (1.5) | B-1 (0.05) | — | — | PGMEA (95) |
| | 9 | Polymer 2 (70) | Polymer 6 (10) | PAG-1 (1.5) | B-1 (0.05) | — | — | PGMEA (95) |
| | 10 | Polymer 1 (70) | Polymer 4 (10) | PAG-2 (1.0) | B-1 (0.05) | — | — | PGMEA (95) |
| | 11 | Polymer 2 (70) | Polymer 4 (10) | PAG-2 (1.0) | B-1 (0.05) | — | — | PGMEA (95) |
| | 12 | Polymer 3 (70) | Polymer 4 (10) | PAG-2 (1.0) | B-1 (0.05) | — | — | PGMEA (95) |
| | 13 | Polymer 1 (70) | Polymer 4 (10) | PAG-1 (1.5) | B-2 (0.05) | — | — | PGMEA (95) |
| | 14 | Polymer 2 (70) | Polymer 4 (10) | PAG-1 (1.5) | B-2 (0.05) | — | — | PGMEA (95) |
| | 15 | Polymer 3 (70) | Polymer 4 (10) | PAG-1 (1.5) | B-2 (0.05) | — | — | PGMEA (95) |
| | 16 | Polymer 1 (70) | Polymer 4 (10) | PAG-1 (1.5) | B-3 (0.05) | — | — | PGMEA (95) |
| | 17 | Polymer 1 (70) | Polymer 4 (10) | PAG-1 (1.5) | B-4 (0.05) | — | — | PGMEA (95) |
| | 18 | Polymer 1 (70) | Polymer 4 (10) | PAG-1 (1.5) | B-1 (0.05) | — | D-1 (5) | PGMEA (95) |
| Comparative Example | 1 | Polymer 1 (70) | Polymer 4 (10) | PAG-1 (1.5) | — | — | — | PGMEA (95) |
| | 2 | Polymer 2 (70) | Polymer 4 (10) | PAG-1 (1.5) | — | — | — | PGMEA (95) |
| | 3 | Polymer 3 (70) | Polymer 4 (10) | PAG-1 (1.5) | — | — | — | PGMEA (95) |
| | 4 | Polymer 2 (70) | Polymer 5 (10) | PAG-1 (1.5) | — | — | — | PGMEA (95) |
| | 5 | Polymer 2 (70) | Polymer 5 (10) | PAG-1 (1.5) | — | Amine-1 (0.1) | — | PGMEA (95) |
| | 6 | Polymer 2 (70) | Polymer 6 (10) | PAG-1 (1.5) | — | — | — | PGMEA (95) |
| | 7 | Polymer 1 (70) | Polymer 4 (10) | PAG-2 (1.0) | — | — | — | PGMEA (95) |
| | 8 | Polymer 2 (70) | Polymer 4 (10) | PAG-2 (1.0) | — | — | — | PGMEA (95) |
| | 9 | Polymer 3 (70) | Polymer 4 (10) | PAG-2 (1.0) | — | — | — | PGMEA (95) |

The value in parentheses is in parts by weight.

-continued

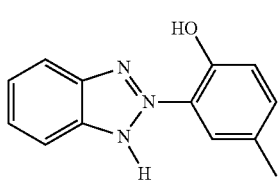
(B-4)

Herein Me stands for methyl.

It is noted that the surfactant used is 0.02 part by weight of X-70-093 (surfactant having perfluoroalkyl-containing siloxane group combined with polyoxyethylene type polyether group, available from Shin-Etsu Chemical Co., Ltd.)

Patterning of Resist Composition

Next, using an i-line stepper NSR-1755i7A (Nikon Corp., NA=0.50), the resist film was exposed to i-line through a reticle. The resist film was baked (PEB) under the conditions shown in Table 2 and developed with a 2.38 wt % tetramethylammonium hydroxide aqueous solution. Specifically, development was carried out by dispensing the developer to the substrate for 10 seconds while spinning the substrate, and holding the developer stationary on the resist film for 50 seconds. The step of dispensing and static holding the developer was repeated 6 times. This was followed by deionized water rinsing and drying.

The resist pattern resulting from development was observed under a scanning electron microscope (SEM). The sensitivity was defined as the exposure dose (mJ/cm$^2$) which resolved the space of a 50-μm 1:1 line-and-space pattern to 50 μm, with the results shown in Table 2. The profile of a 50-μm 1:1 line-and-space pattern at the dose is also reported in Table 2. It was confirmed whether or not the pattern deformed and/or collapsed owing to generation of bubbles or the like.

TABLE 2

|  |  | Soft bake (° C./300 sec) | PEB (° C./300 sec) | Sensitivity (mJ/cm$^2$) | Pattern profile | Bubbles |
|---|---|---|---|---|---|---|
| Example | 1 | 130 | 120 | 1,300 | rectangular, good pattern bottom | nil |
|  | 2 | 130 | 120 | 1,300 | rectangular, good pattern bottom | nil |
|  | 3 | 130 | 120 | 1,300 | rectangular, good pattern bottom | nil |
|  | 4 | 130 | 120 | 1,300 | rectangular, good pattern bottom | nil |
|  | 5 | 130 | 120 | 2,200 | rectangular, good pattern bottom | nil |
|  | 6 | 130 | 120 | 1,300 | rectangular, good pattern bottom | nil |
|  | 7 | 130 | 120 | 1,500 | rectangular, good pattern bottom | nil |
|  | 8 | 130 | 120 | 2,100 | rectangular, good pattern bottom | nil |
|  | 9 | 110 | 110 | 1,300 | rectangular, good pattern bottom | nil |
|  | 10 | 110 | 110 | 900 | rectangular, good pattern bottom | nil |
|  | 11 | 110 | 110 | 900 | rectangular, good pattern bottom | nil |
|  | 12 | 130 | 120 | 1,500 | rectangular, good pattern bottom | nil |
|  | 13 | 130 | 120 | 1,500 | rectangular, good pattern bottom | nil |
|  | 14 | 130 | 120 | 1,500 | rectangular, good pattern bottom | nil |
|  | 15 | 130 | 120 | 1,500 | rectangular, good pattern bottom | nil |
|  | 16 | 130 | 120 | 1,500 | rectangular, good pattern bottom | nil |
|  | 17 | 130 | 120 | 1,500 | rectangular, good pattern bottom | nil |
|  | 18 | 130 | 120 | 1,600 | rectangular, good pattern bottom | nil |
| Comparative Example | 1 | 130 | 120 | 1,200 | footing | nil |
|  | 2 | 130 | 120 | 1,200 | footing | nil |
|  | 3 | 130 | 120 | 1,200 | footing | nil |
|  | 4 | 130 | 120 | 1,200 | footing | nil |
|  | 5 | 130 | 120 | 2,200 | footing | nil |
|  | 6 | 130 | 120 | 1,200 | footing | nil |
|  | 7 | 110 | 110 | 2,000 | undercut | nil |
|  | 8 | 110 | 110 | 2,000 | undercut | nil |
|  | 9 | 110 | 110 | 2,000 | undercut | nil |

Crack Resistance Test

After the resist pattern was formed as above, the resist pattern and the substrate surface was treated with an oxygen plasma by operating a dry etching system DEM-451 (Nichiden Anelva Co., Ltd.) at 100 W for 30 seconds, to effect ashing. The substrate was immersed in a gold plating bath (Tanaka Precious Metals K.K., Microfab Au100, pH 4.6), where electroplating of gold was carried out by a constant current flow at 60° C. for 100 minutes, depositing a gold layer of about 15 μm thick. After plating, the surface was washed with flowing deionized water. The resist surface was observed under an optical microscope and SEM. The resist film was examined for deformation and cracking by growth stress of plating. With respect to crack resistance, 4,500 points or crack-sensitive corners on a resist pattern as shown in FIG. 1 were inspected. The number of cracks generated was counted. The sample was rated high crack resistance when the count was less than 100 points among 4,500 points. The results are shown in Table 3. In FIG. 1, "A" designates a crack inspecting area which includes 6×5×5=150 points within one shot ranging from 50 μm to 10 μm, indicating that on the entire wafer surface (30 shots, shown left), 150×30=4,500 points were inspected.

Solder Plating Bath Test

After the resist pattern was formed as above, the substrate was immersed in a plating bath. Thereafter, the resist pattern was observed under SEM. The sample was rated good when the resist pattern after plating bath immersion was unchanged from the resist pattern prior to immersion. The results are shown in Table 3.

The plating bath conditions included an electroplating bath TS-120 (Sn—Ag alloy plating solution, Ishihara Chemical Co., Ltd.), 25° C., and 120 minutes of immersion.

TABLE 3

|  | Crack resistance test | Plating bath test |
|---|---|---|
| Example 1 | good | unchanged |
| Example 2 | good | unchanged |
| Example 3 | good | unchanged |
| Example 4 | good | unchanged |
| Example 5 | good | unchanged |
| Example 6 | good | unchanged |
| Example 7 | good | unchanged |
| Example 8 | good | unchanged |
| Example 9 | good | unchanged |
| Example 10 | good | unchanged |
| Example 11 | good | unchanged |
| Example 12 | good | unchanged |
| Example 13 | good | unchanged |
| Example 14 | good | unchanged |
| Example 15 | good | unchanged |
| Example 16 | good | unchanged |
| Example 17 | good | unchanged |
| Example 18 | good | unchanged |

Japanese Patent Application No. 2011-161860 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising (A) an organic solvent, (B) a base resin, (C) a photoacid generator, and (D) a benzotriazole compound, the benzotriazole compound (D) having the general formula (1) or (2):

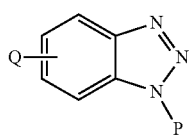
(1)

wherein P is hydrogen, hydroxyl, a substituted or unsubstituted alkyl, substituted or unsubstituted phenyl, sulfonic acid or derivative thereof, or —Z—Y, Z is an alkylene, cycloalkylene or alkylene ether group which may be substituted with carboxyl, Y is a hydroxyl, alkoxy, carboxyl or dialkylamino group, Q is hydrogen, halogen, hydroxyl, alkyl, alkoxy group or an organic group having the formula (3):

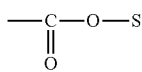
(3)

wherein S is a $C_1$-$C_{12}$ alkyl or aldehyde group,

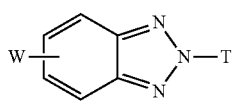
(2)

wherein T is hydrogen, hydroxyl, a substituted or unsubstituted alkyl, or substituted or unsubstituted phenyl, and W is hydrogen, halogen, hydroxyl, alkyl or alkoxy, the base resin (B) comprising 100 parts by weight of a first polymer comprising recurring units represented by the general formula (7):

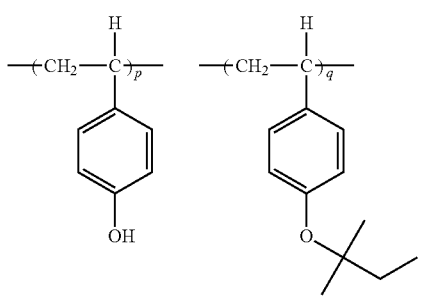
(7)

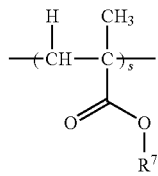

wherein $R^7$ is $C_4$-$C_{30}$ alkyl, $0.4 \leq p\ 0.8$, $0 < q \leq 0.5$, $0 < s \leq 0.3$, and $p+q+s=1$, and having a weight average molecular weight of 5,000 to 100,000, and 2 to 30 parts by weight of a vinyl ether polymer consisting of recurring units represented by the general formula (5):

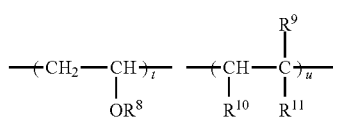
(5)

wherein $R^8$ is hydrogen or a straight or branched $C_1$-$C_{12}$ alkyl group, $R^9$ is hydrogen or methyl, $R^{10}$ is hydrogen or an organic group of the general formula (6):

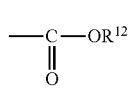
(6)

wherein $R^{12}$ is hydrogen or methyl, $R^{11}$ is an organic group of formula (6), nitrile or halogen, t and u are numbers in the range: $t+u=1$ and $0 \leq u \leq 0.5$, and having a weight average molecular weight of 10,000 to 500,000.

2. The resist composition of claim 1 wherein the benzotriazole compound (D) is present in an amount of 0.01 to 10 parts by weight relative to 100 parts by weight of the base resin (B).

3. The resist composition of claim 1, further comprising (E) a dissolution inhibitor.

4. The resist composition of claim 1, further comprising (F) a basic compound.

5. A pattern forming process comprising the steps of:
   (i) coating the resist composition of claim 1 onto a substrate and prebaking to form a resist film,
   (ii) exposing the resist film to UV radiation having a wavelength of up to 500 nm through a photomask, and
   (iii) optionally baking, and developing with a developer to form a resist pattern.

6. The process of claim 5 wherein the substrate is a substrate having a conductive layer on its surface, and the process further comprises, after the developing step (iii),
   (iv) subjecting the resist pattern-bearing substrate to ashing with an oxygen plasma for thereby removing any resist residue on the pattern and rendering the resist pattern surface hydrophilic,
   (v) performing electroplating or electroless plating using the resist pattern as a mold, for thereby depositing a metal pattern on the conductive substrate to a predetermined thickness, and
   (vi) removing the resist pattern which has served as the mold for depositing the metal pattern, from the substrate.

7. The process of claim 5 wherein the resist film has a thickness of 5 to 100 μm.

8. The resist composition of claim 1 wherein the benzotriazole compound has the following general formula (2):

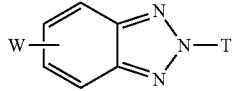
(2)

wherein T is hydrogen, hydroxyl, a substituted or unsubstituted alkyl, or substituted or unsubstituted phenyl, and W is hydrogen, halogen, hydroxyl, alkyl or alkoxy.

9. A chemically amplified positive resist composition comprising (A) an organic solvent, (B) a base resin, (C) a photoacid generator, and (D) a benzotriazole compound,
   the benzotriazole compound (D) having the general formula (1) or (2):

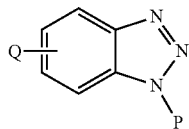
(1)

wherein P is hydrogen, hydroxyl, a substituted or unsubstituted alkyl, substituted or unsubstituted phenyl, sulfonic acid or derivative thereof, or —Z—Y, Z is an alkylene, cycloalkylene or alkylene ether group which may be substituted with carboxyl, Y is a hydroxyl, alkoxy, carboxyl or dialkylamino group, Q is hydrogen, halogen, hydroxyl, alkyl, alkoxy group or an organic group having the formula (3):

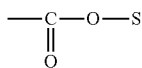
(3)

wherein S is $C_1$-$C_{12}$ alkyl or aldehyde group,

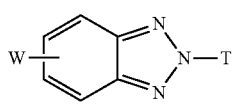
(2)

wherein T is hydrogen, hydroxyl, a substituted or unsubstituted alkyl, or substituted or unsubstituted phenyl, and W is hydrogen, halogen, hydroxyl, alkyl or alkoxy,
   the base resin (B) comprising 100 parts by weight of a first polymer comprising recurring units selected from the group consisting of formulae (4)-2 to (4)-5 and having a weight average molecular weight of 1,000 to 500,000 and 2 to 30 parts by weight of a vinyl ether polymer consisting of recurring units represented by the general formula (5) and having a weight average molecular weight of 10,000 to 500,000,

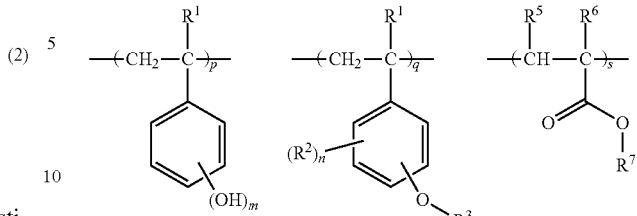
(4)-2 wherein $R^1$ is hydrogen, hydroxyl, straight alkyl, branched alkyl, halogen or trifluoromethyl, $R^2$ is hydrogen, hydroxyl, halogen or trifluoromethyl, $R^3$ is a $C_4$-$C_{12}$ tertiary alkyl group, $R^5$ is hydrogen or methyl, $R^6$ is hydrogen, methyl, alkoxycarbonyl, cyano, halogen or trifluoromethyl, $R^7$ is $C_4$-$C_{30}$ alkyl, $0.4 \leq p \leq 0.8$, $0 < q \leq 0.5$, $0 < s \leq 0.3$, and $p+q+s=1$,

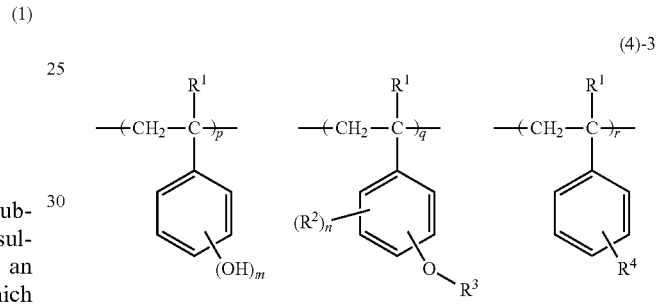
(4)-3 wherein $R^1$ and $R^3$ are as defined above, $R^4$ is hydrogen, an acid labile group, or ditrifluoromethylhydroxyl, $0.4 \leq p \leq 0.8$, $0 < q \leq 0.5$, $0.1 \leq r \leq 0.5$, and $p+q+r=1$,

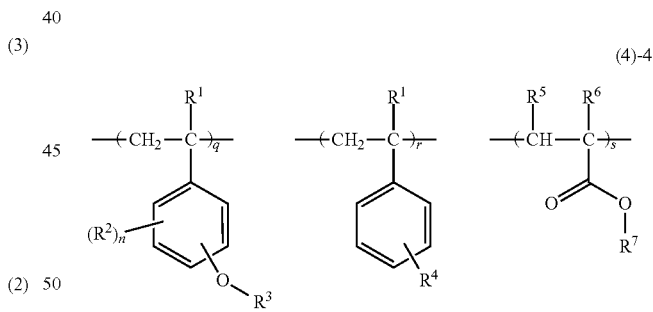
(4)-4 wherein $R^1$, $R^2$, $R^3$, $R^4$, $R^5$, $R^6$ and $R^7$ are as defined above, $0 < q \leq 0.5$, $0.2 \leq r < 0.5$, $0 < s \leq 0.3$, and $q+r+s=1$,

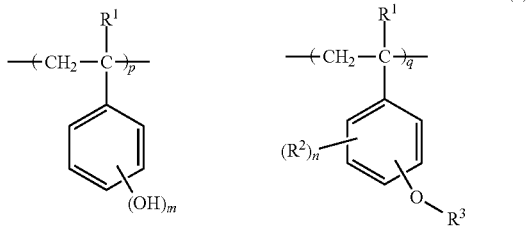
(4)-5

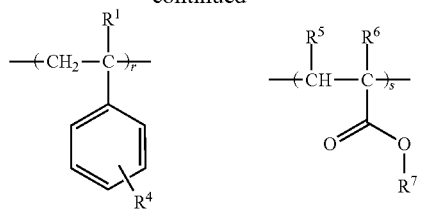

wherein $R^1$, $R^2$, $R^3$, $R^4$, $R^5$, $R^6$ and $R^7$ are as defined above, $0<q\leq0.5$, $0.3\leq p\leq0.8$, $0.1\leq r\leq0.5$, $0\leq s\leq0.3$, and $p+q+r+s=1$.

(5)

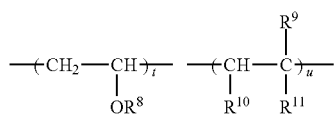

wherein $R^8$ is hydrogen or a straight or branched $C_1$-$C_{12}$ alkyl group, $R^9$ is hydrogen or methyl, $R^{10}$ is hydrogen or an organic group of the general formula (6):

(6)

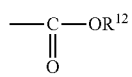

wherein $R^{12}$ is hydrogen or methyl, $R^{11}$ is an organic group of formula (6), nitrile or halogen, t and u are numbers in the range: $t+u=1$ and $0<u\leq0.5$.

10. The resist composition of claim 9 wherein the benzotriazole compound (D) is present in an amount of 0.01 to 10 parts by weight relative to 100 parts by weight of the base resin (B).

11. The resist composition of claim 9 wherein the benzotriazole compound has the following general formula (2):

(2)

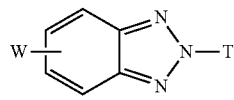

wherein T is hydrogen, hydroxyl, a substituted or unsubstituted alkyl, or substituted or unsubstituted phenyl, and W is hydrogen, halogen, hydroxyl, alkyl or alkoxy.

12. The resist composition of claim 9 wherein the first polymer is selected from the group consisting of the following polymers of formulae (4)-2 and (4)-5;

(4)-2

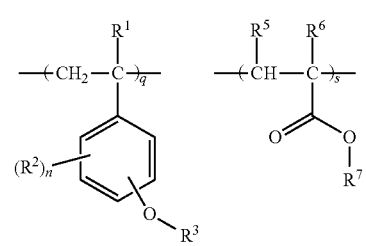

wherein $R^1$ is hydrogen, hydroxyl, straight alkyl, branched alkyl, halogen or trifluoromethyl, $R^2$ is hydrogen, hydroxyl, halogen or trifluoromethyl, $R^3$ is a $C_4$-$C_{12}$ tertiary alkyl group, $R^5$ is hydrogen or methyl, $R^6$ is hydrogen, methyl, alkoxycarbonyl, cyano, halogen or trifluoromethyl, $R^7$ is $C_4$-$C_{30}$ alkyl, $0.4\leq p\leq0.8$, $0,<q\leq0.5$, $0<s\leq0.3$ and $p+q+s=1$.

(4)-5

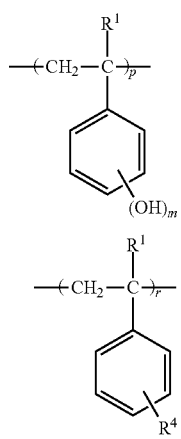

wherein $R^1$, $R^2$, $R^3$, $R^4$, $R^5$, $R^6$ and $R^7$ are as defined above, $R^4$ is hydrogen, an acid labile group, or ditrifluoromethylhydroxyl, $0<q\leq0.5$, $0.3\leq p\leq0.8$, $0.1\leq r\leq0.5$, $0<s\leq0.3$, and $p+q+r+s=1$.

13. The resist composition of claim 9, further comprising (E) a dissolution inhibitor.

14. The resist composition of claim 9, further comprising (F) a basic compound.

15. The pattern forming process comprising the steps of:
(i) coating the resist composition of claim 9 onto a substrate and prebaking to form a resist film,
(ii) exposing the resist film to UV radiation having a wavelength of up to 500 nm through a photomask, and
(iii) optionally baking, and developing with a developer to form a resist pattern.

16. The process of claim 15 wherein the substrate is a substrate having a conductive layer on its surface, and the process further comprises, after the developing step (iii),
(iv) subjecting the resist pattern-bearing substrate to ashing with an oxygen plasma for thereby removing any resist residue on the pattern and rendering the resist pattern surface hydrophilic,
(v) performing electroplating or electroless plating using the resist pattern as a mold, for thereby depositing a metal pattern on the conductive substrate to a predetermined thickness, and
(vi) removing the resist pattern which has served as the mold for depositing the metal pattern, from the substrate.

17. The process of claim 15 wherein the resist film has a thickness of 5 to 100 μm.

* * * * *